United States Patent
Hirano et al.

(10) Patent No.: US 8,476,718 B2
(45) Date of Patent: Jul. 2, 2013

(54) SEMICONDUCTOR DEVICE INCLUDING A GATE INSULATING FILM HAVING A METAL OXIDE LAYER HAVING TRAP LEVELS

(75) Inventors: Izumi Hirano, Fujisawa (JP); Yuichiro Mitani, Kanagawa-Ken (JP); Tatsuo Shimizu, Tokyo (JP); Yasushi Nakasaki, Yokohama (JP); Akiko Masada, Tokyo (JP); Shigeto Fukatsu, Yokohama (JP); Masahiro Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 12/710,851

(22) Filed: Feb. 23, 2010

(65) Prior Publication Data

US 2010/0244157 A1    Sep. 30, 2010

(30) Foreign Application Priority Data

Mar. 25, 2009    (JP) ................. 2009-074427

(51) Int. Cl.
*H01L 21/02*    (2006.01)
(52) U.S. Cl.
USPC ...... 257/411; 257/E29.55; 257/315; 257/369; 257/368
(58) Field of Classification Search
USPC .................. 257/411, E29.255, 315, 368, 369
See application file for complete search history.

(56) References Cited

U.S. PATENT DOCUMENTS

| 7,525,144 B2 | 4/2009 | Shimizu et al. | |
| 2005/0082605 A1* | 4/2005 | Akasaka | 257/329 |
| 2007/0126045 A1* | 6/2007 | Choi et al. | 257/310 |
| 2007/0132003 A1* | 6/2007 | Takashima et al. | 257/315 |
| 2008/0135922 A1 | 6/2008 | Mitani et al. | |
| 2008/0258244 A1* | 10/2008 | Goto et al. | 257/412 |

(Continued)

FOREIGN PATENT DOCUMENTS

| JP | 2005-183422 | 7/2005 |
| JP | 2007-49001 | 2/2007 |

OTHER PUBLICATIONS

U.S. Appl. No. 12/403,493, filed Mar. 13, 2009, Masahiro Koike, et al.

(Continued)

*Primary Examiner* — Eugene Lee
*Assistant Examiner* — Elias M Ullah
(74) *Attorney, Agent, or Firm* — Oblon, Spivak, McClelland, Maier & Neustadt, L.L.P.

(57) ABSTRACT

A semiconductor device includes a MISFET comprising: a semiconductor layer including a semiconductor region formed therein; a gate insulating film formed above the semiconductor region, and including a metal oxide layer containing a metal and oxygen, the metal contained in the metal oxide layer being at least one selected from Hf and Zr, the metal oxide layer further including at least one element selected from the group consisting of Ru, Cr, Os, V, Tc, and Nb, the metal oxide layer having sites that capture or release charges formed by inclusion of the element, density of the element in the metal oxide layer being in the range of $1\times10^{15}$ cm$^{-3}$ to $2.96\times10^{20}$ cm$^{-3}$, the sites being distributed to have a peak closer to the semiconductor region than to a center of the metal oxide layer; and a gate electrode formed on the gate insulating film.

8 Claims, 28 Drawing Sheets

U.S. PATENT DOCUMENTS

| | | | |
|---|---|---|---|
| 2008/0303099 A1* | 12/2008 | Iwamoto et al. | 257/369 |
| 2009/0086549 A1* | 4/2009 | Fujiki | 365/185.28 |
| 2009/0114996 A1* | 5/2009 | Inumiya et al. | 257/369 |
| 2009/0134465 A1* | 5/2009 | Shimizu | 257/368 |
| 2009/0267134 A1 | 10/2009 | Koike et al. | |
| 2009/0294877 A1* | 12/2009 | Tsutsui | 257/411 |
| 2009/0309165 A1* | 12/2009 | Ogawa et al. | 257/369 |
| 2010/0244157 A1* | 9/2010 | Hirano et al. | 257/411 |

OTHER PUBLICATIONS

U.S. Appl. No. 09/324,868, filed Jun. 3, 1999, Masahiro Koike, et al.

Seiji Inumiya, et al., "Determination of Time to Breakdown of 0.8-1.2nm EOT HfSiON Gate Dielectrics with Poly-Si and Metal Gate Electrodes", Proceedings of International Reliability Physics Symposium, IEEE, 2006, pp. 184-188.

* cited by examiner

| SAMPLE | GATE ELECTRODE | INSULATING FILM | PHYSICAL FILM THICKNESS | EOT | (n-CHANNEL MISFET) |
|---|---|---|---|---|---|
| A | n+POLYCRYSTALLINE SILICON | HfSiON | 2.3nm~ 2.5nm | 0.9nm~ 1.1nm | |
| B | Ni₂Si | | | | |
| C | TiN | | | | |
| D | *TaCx-1 3nm | | | | |
| E | *TaCx-1 5nm | | | | |
| F | *TaCx-1 10nm | | | | |
| G | **TaCx-2 10nm | | | | |

*TaCx-1:Ta-RICH      **TaCx-2:C-RICH

SEMICONDUCTOR DEVICE INCLUDING A GATE INSULATING FILM HAVING A METAL OXIDE LAYER HAVING TRAP LEVELS

CROSS-REFERENCE TO RELATED APPLICATION

This application is based upon and claims the benefit of priority from prior Japanese Patent Application No. 2009-74427 filed on Mar. 25, 2009 in Japan, the entire contents of which are incorporated herein by reference.

BACKGROUND

1. Technical Field

Described herein is a semiconductor device including a MISFET.

2. Related Art

In a MISFET (Metal-Insulator-Semiconductor Field Effect Transistor), the problem of an increase in leakage current between the gate electrode and the substrate is caused by a direct tunneling phenomenon of carriers in a gate insulating film. To avoid such a tunneling phenomenon, formation of the gate insulating film with the use of a material having higher relative permittivity than $SiO_2$ has been suggested. More specifically, the use of a high-dielectric metal oxide such as $ZrO_2$, $HfO_2$, a compound with $SiO_2$, or silicate has been suggested.

Instead of conventional polycrystalline silicon, the use of a metal material for the gate electrode has been considered, to adjust degradation of characteristics due to depletion of the gate electrode and adjust the threshold voltage.

In a MISFET having a gate insulating film including a high-dielectric metal oxide layer, the TDDB (Time Dependent Dielectric Breakdown) lifetime of the gate insulating film is not sufficient to guarantee the device, and it is necessary to improve the reliability of the gate insulating film. To guarantee the lifetime of a device, the lifetime is determined in terms of the necessary area and percent defective by performing statistical processing. Particularly, in a MISFET having a gate insulating film including a high-dielectric metal oxide layer, the distribution of TDDB lifetime is reportedly too wide (as disclosed by S. Inumiya et al., in "DETERMINATION OF TIME TO BE BREAKDOWN OF 0.8-1.2 NM EOT HfSiON GATE DIELECTRICS WITH Poly-Si AND METAL GATE ELECTRODES", IEEE 06CH37728, 44th Annual International Reliability Physics Symposium, Sa Joes, 2006, p.p. 184-188, for example). Therefore, in terms of the area and percent defective necessary for guaranteeing the device, the life becomes very short.

SUMMARY

Possible embodiments of this invention are made in view of these circumstances, and some embodiments of this invention may provide a semiconductor device including a MISFET that can maximize its lifetime.

A semiconductor device according to a first aspect of the present invention includes a MISFET comprising: a semiconductor layer including a semiconductor region formed therein; a gate insulating film formed above the semiconductor region, and including a metal oxide layer containing a metal and oxygen, the metal contained in the metal oxide layer being at least one selected from Hf and Zr, the metal oxide layer further including at least one element selected from the group consisting of Ru, Cr, Os, V, Tc, and Nb, the metal oxide layer having sites that capture or release charges formed by inclusion of the element, density of the element in the metal oxide layer being in the range of $1 \times 10^{15}$ $cm^{-3}$ to $2.96 \times 10^{20}$ $cm^{-3}$, the sites being distributed to have a peak closer to the semiconductor region than to a center of the metal oxide layer; and a gate electrode formed on the gate insulating film.

A semiconductor device according to a second aspect of the present invention includes a MISFET comprising: a semiconductor layer including a semiconductor region formed therein; a gate insulating film formed above the semiconductor region, and including a metal oxide layer containing a metal and oxygen, the metal contained in the metal oxide layer being at least one selected from the group consisting of La, Ce, Pr, Nd, Pm, Sm, Eu, Gd, Tb, Dy, Ho, Er, Tm, Yb, and Lu, the metal oxide layer further including at least one element selected from the group consisting of V, Cr, Mn, Fe, Zr, Nb, Mo, Tc, Rh, Hf, Ta, Re, Os, and Ir, the metal oxide layer having sites that capture or release charges formed by addition of the element, density of the element in the metal oxide layer being in the range of $1 \times 10^{15}$ $cm^{-3}$ to $2.96 \times 10^{20}$ $cm^{-3}$, the sites being distributed to have a peak closer to the semiconductor region than to a center of the metal oxide layer; and a gate electrode formed on the gate insulating film.

DETAILED DESCRIPTION

Before describing the embodiments, the course of events for achieving the present invention will be described below.

Figures 1, 2:
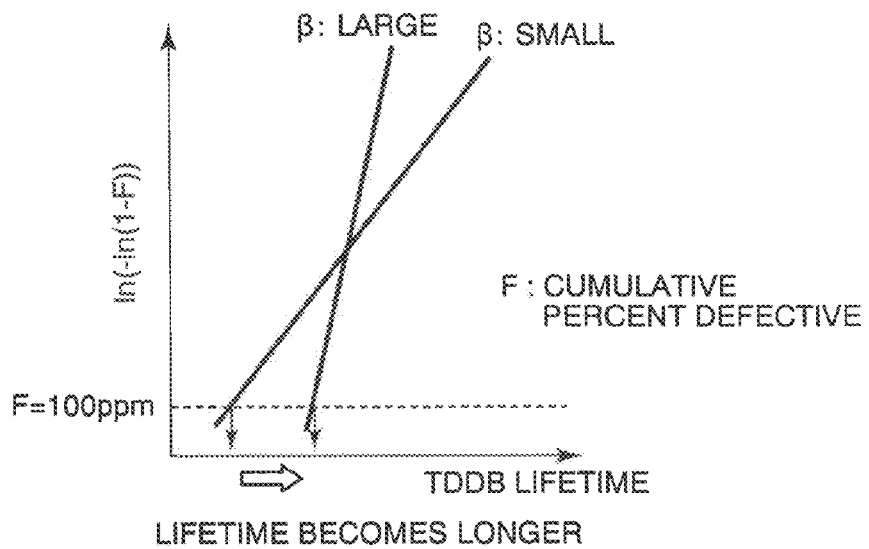
FIG. 1 is a graph showing changes of lifetime by distributions (Weibull plots)
FIG. 2 is a table showing the specifics of samples.

Normally, the TDDB lifetime of device is determined with the use of a Weibull distribution. Referring to FIG. 1, Weibull plots indicating distributions of TDDB lifetime of devices are described. In FIG. 1, the abscissa axis indicates the TDDB lifetime, and the ordinate axis indicates the function ln (−ln (1−F)) of the cumulative percent defective F. Here, in ( ) represents natural logarithm. With the gradient of each distribution being β, the lifetime of an actual device is longer where the shape parameter β of the Weibull distribution is large, with the cumulative percent defective F having a very small value (100 ppm (parts per million), for example) as the index.

Samples A through G of n-channel MISFETs (hereinafter also referred to as n-MISFETs) having metal gate electrodes made of various materials were produced. Each of the samples A through G has a gate insulating film on a silicon substrate. This gate insulating film is a stack structure formed with a SiO₂ layer and a HfSiON layer formed on the SiO₂ layer. The physical film thickness of the gate insulating film is 2.3 nm to 2.5 nm, and the equivalent oxide thickness EOT of the gate insulating film is 0.9 nm to 1.1 nm. As for the gate electrode, the sample A has a gate electrode made of n⁺-polycrystalline silicon, the sample B has a gate electrode made of Ni₂Si, the sample C has a gate electrode made of TiN, the sample D has a gate electrode formed with a Ta-rich TaC layer of 3 nm in film thickness, the sample E has a gate electrode formed with a Ta-rich TaC layer of 5 nm in film thickness, the sample F has a gate electrode formed with a Ta-rich TaC layer of 10 nm in film thickness, and the sample G has a gate electrode formed with a C-rich TaC layer of 10 nm in film thickness.

Figure 3:
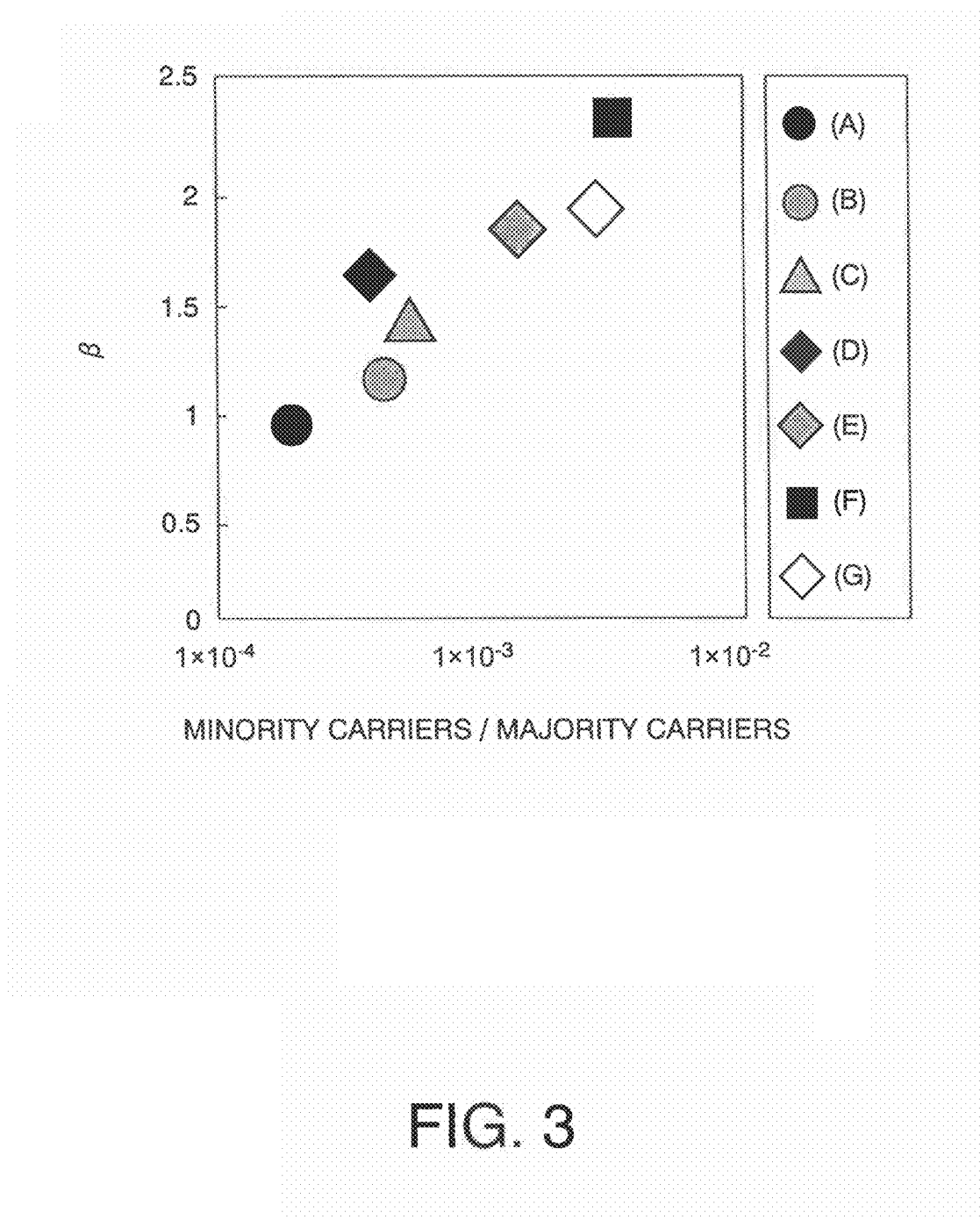
FIG. 3 is a graph showing the correlation between the shape parameter β of the Weibull distribution of each sample and the ratio of the minority carriers to the majority carriers flowing in each sample.

FIG. 3 shows the shape parameter β of the Weibull distribution of the samples A through G, with respect to the ratio of the minority carriers to the majority carriers flowing in the gate insulating film. As can be seen from FIG. 3, though the same gate insulating film is used in the samples A through G, the shape parameter β of the Weibull distribution greatly depends on the material of the gate electrode, and tends to be greater where the ratio of the minority carriers to the majority carriers flowing in the gate insulating film (=minority carriers/majority carriers) is higher. In view of this, the TDDB lifetime is expected to be made longer by performing modulation to increase the ratio of the minority carriers to majority carriers in the gate insulating film.

Figure 4:
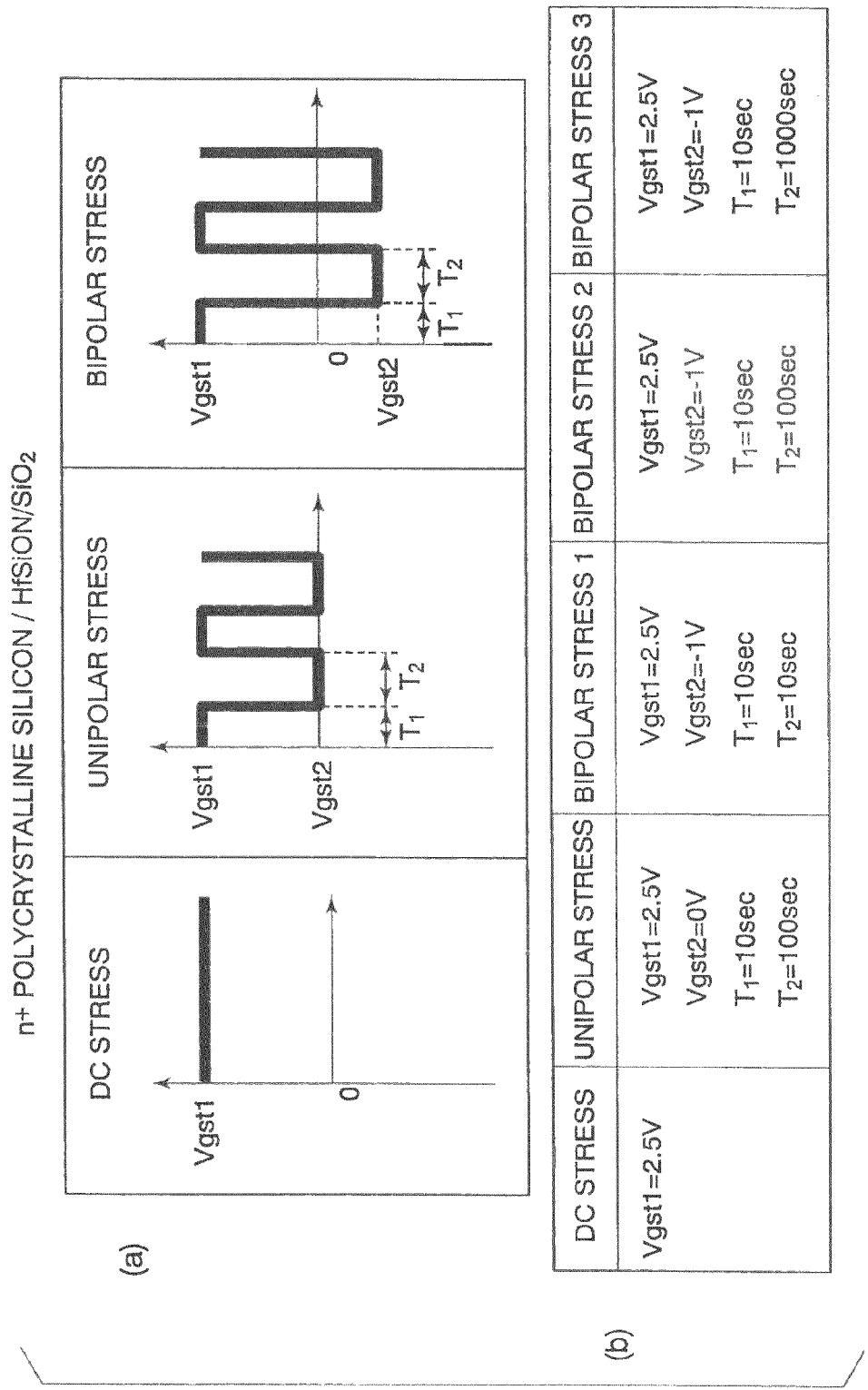
FIGS. 4(a) and 4(b) show the waveforms of stress applied to MISFETs and the stress conditions.

In an n-MISFET having a stack gate structure formed with a n⁺-polycrystalline silicon gate electrode, a HfSiON layer, and a SiO₂ layer, the balance of carriers flowing in the gate insulating film is modulated by changing the method of application of stress, and the TDDB lifetime is examined. FIGS. 4(a) and 4(b) show the results of the examination. As shown in FIG. 4(a), there are three kinds of stress. The first kind of stress is a constant positive voltage Vgst1, or DC stress. The second kind of stress is an alternately applied stress, with the application periods of the first voltage Vgst1 and the second voltage Vgst2 being T1 and T2. The second kind of stress is unipolar stress, with the second voltage Vgst2 being 0. In application of unipolar stress, a positive voltage is periodically applied. The third kind of stress is an alternately applied stress, with the application periods of the first voltage Vgst1 and the second voltage Vgst2 being T1 and T2. The third kinds of stress is bipolar stress, with the second voltage Vgst2 being negative. In application of the bipolar stress, a positive voltage and a negative voltage are alternately applied. Accordingly, with the DC stress or the unipolar stress, the balance among the carriers flowing in the gate insulating film stays the same. With the bipolar stress, on the other hand, biases of the opposite polarities are applied, and the balance among the carriers in the gate insulating film changes.

As shown in FIG. 4(b), there are first through fifth methods of application of stress to the gate insulating film. By the first application method, a DC stress having a voltage Vgst1 of 2.5 V is applied. By the second application method, a unipolar stress having a voltage Vgst1 of 2.5 V and a voltage Vgst2 of 0 V is applied, with T1 being equal to T2, which is 10 seconds. By the third application method, a bipolar stress having a voltage Vgst1 of 2.5 V and a voltage Vgst2 of −1 V is applied, with T1 being equal to T2, which is 10 seconds (hereinafter also referred to as the bipolar stress 1). By the fourth application method, a bipolar stress having a voltage Vgst1 of 2.5 V and a voltage Vgst2 of −1 V is applied, with T1 being 10 seconds, T2 being 100 seconds (hereinafter also referred to as the bipolar stress 2). By the fifth application method, a bipolar stress having a voltage Vgst1 of 2.5 V and a voltage Vgst2 of −1 V is applied, with T1 being 10 seconds, T2 being 1000 seconds (hereinafter also referred to as the bipolar stress 3). Among the third through fifth application methods, the stress application period T2 on the accumulation side is varied, while the stress application period T1 on the reverse side is fixed (at 10 seconds). By extending T2 of a bipolar stress, the amount of carriers injected with the reverse bias (the stress on the accumulation side) increases, and the proportion of the minority carriers becomes higher during the application of stress.

Figure 5:
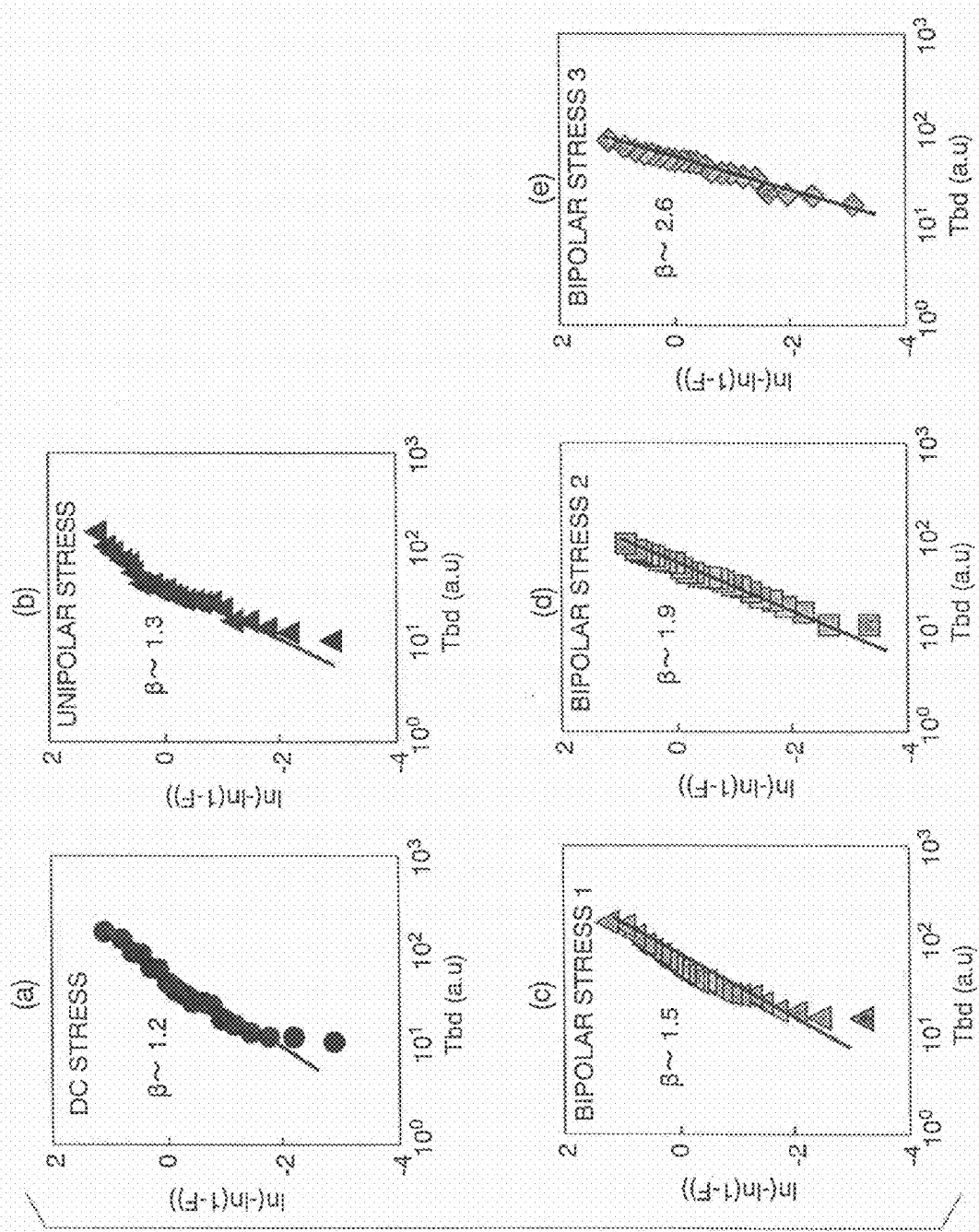
FIGS. 5(a) through 5(e) are graphs showing the Weibull distributions of the samples with respect to the stress conditions shown in FIGS. 4(a) and 4(b)

FIGS. 5(*a*), 5(*b*), 5(*c*), 5(*d*), and 5(*e*) show the Weibull plots of the TDDB lifetime obtained when stress is applied to n-MISFETs by the above described first through fifth application methods. As can be seen from FIGS. 5(*a*) through 5(*e*), where a DC stress or unipolar stress is applied, the shape parameter β of the Weibull distribution is approximately 1.2. On the other hand, where a bipolar stress is applied, the shape parameter β of the Weibull distribution is as large as 1.5 to 2.6. Also, as the stress application period T2 on the accumulation side of the bipolar stress becomes longer, the shape parameter β of the Weibull distribution becomes greater.

Figure 6:
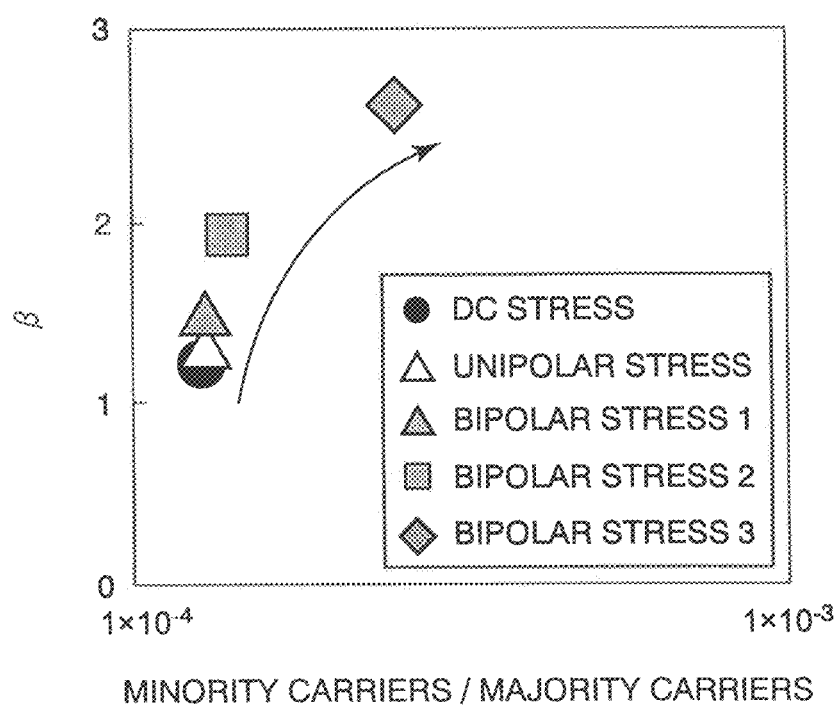
FIG. 6 is a graph showing the correlation between the shape parameter β of the Weibull distribution observed when stress is applied and the ratio of the minority carriers to the majority carriers during the stress.

FIG. 6 shows the dependence of the ratio between the minority carriers and the majority carriers on the shape parameter β of the Weibull distribution in a case where the stress applied is varied. As can be seen from FIG. 6, the shape parameter β of the Weibull distribution tends to become greater, as the ratio of the minority carriers to the majority carriers flowing in the gate insulating film becomes higher.

The above results of experiments show that the distribution of TDDB lifetime can be modulated, and the gradient β of the distribution can be made greater by changing the ratio between the minority carriers and the majority carriers in the gate insulating film.

With the above aspects being taken into consideration, in each of the following embodiments of the present invention, an additional element is added to the gate insulating film having a high-dielectric metal oxide layer. By doing so, a charge trap (hereinafter also referred to simply as the "trap" or "site") that traps (captures or releases) charges (electrons or holes) is intentionally formed in the metal oxide layer forming the gate insulating film. By increasing the current flowing via the charge trap (site), the ratio of the minority carriers to the majority carriers is made higher. In this manner, a semiconductor device having a steep TDDB lifetime distribution (with a large β) is formed.

The following is a detailed description of embodiments and examples of the present invention, with reference to the accompanying drawings. In the drawings, like components are denoted by same reference numerals, and the same explanation will not be repeated. Each of the drawings is schematic, and the shapes, sizes, and proportions of the components shown in the drawings might differ from the components in actual devices. However, in manufacturing an actual device, the following description and conventional arts can be taken into accounts.

(First Embodiment)

Figure 7:
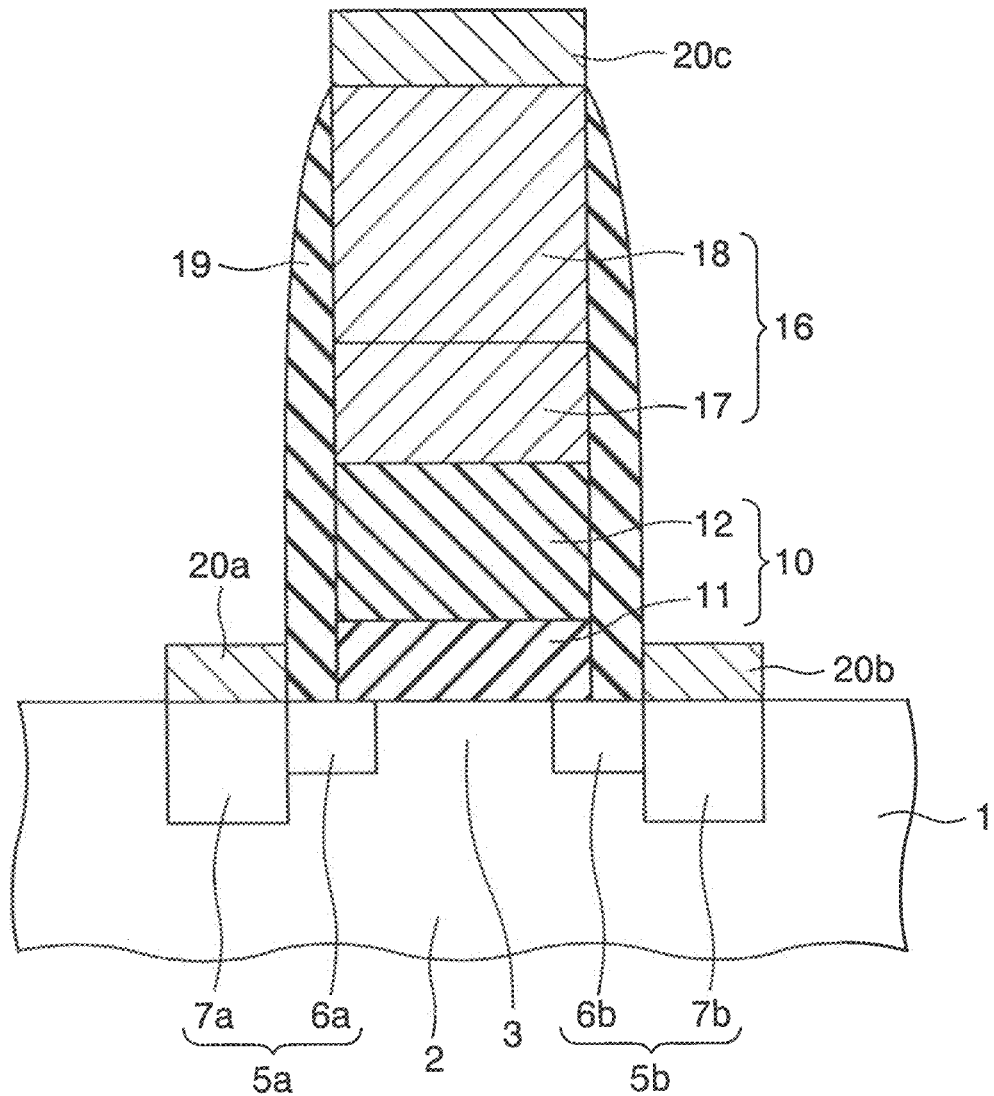
FIG. 7 is a cross-sectional view of a semiconductor device according to a first embodiment of the present invention.

FIG. 7 shows a semiconductor device according to a first embodiment. This semiconductor device is a MISFET, and is formed in a semiconductor region 2 of a semiconductor layer. The semiconductor device of this embodiment can be used in a logic circuit. The semiconductor layer is formed in a semiconductor substrate 1. The semiconductor layer may be part of a semiconductor substrate, or may be a well region formed in a semiconductor substrate. Alternatively, the semiconductor layer may be a SOI layer of a SOI (Silicon On Insulator) substrate. In the semiconductor region 2, a source region 5*a* and a drain region 5*b* of a different conductivity type from the semiconductor region are formed at a distance from each other. The source region 5*a* has an impurity layer 6*a* of a small junction depth and an impurity layer 7*a* of a large junction depth. The drain region 5*b* has an impurity region 6*b* of a small junction depth and an impurity layer 7*b* of a large junction depth. A gate insulating film 10 having a stack structure of an interfacial oxide layer 11 and a high-dielectric layer 12 formed on the interface oxide layer 11 is formed on the semiconductor region 2 to be a channel 3 located between the source region 5*a* and the drain region 5*b*. The interfacial oxide layer 11 is a silicon oxide layer and a silicon oxynitride layer, and the high-dielectric layer 12 is a metal oxide layer with a high dielectric constant. A gate electrode 16 having a stack structure of a metal film 17 and a polycrystalline silicon film 18 formed on the metal film 17 is formed on the gate insulating film 10. A gate sidewall 19 made of an insulating material (such as silicon nitride) is formed on the side faces of the gate insulating film 10 and the gate electrode 16. Metal silicide layers 20*a*, 20*b*, and 20*c* are formed on the source region 5*a*, the drain region 5*b*, and the polycrystalline silicon film 18 of the gate electrode 16, respectively.

The basic structure described above is the same as a conventional MISFET. In this embodiment, however, the high-dielectric layer 12 is a metal oxide layer with a high dielectric constant, and at least one element selected from the group consisting of Ru, Cr, Os, V, Fe, Tc, Nb, and Ta is added to the metal oxide layer. Among those additional elements, Ru is easily available at low cost, and has excellent compatibility with semiconductor manufacture processes. In this embodiment, the metal element serving as a main component of the metal oxide layer includes at least one element selected from hafnium and zirconium.

It is known that, where an element selected from the group consisting of Ru, Cr, Os, V, Tc, and Nb is added to a hafnia (HfO) layer, a hafnium silicate (HfSiO) layer, a nitrided hafnium silicate (HfSiON) layer, or a hafnium aluminate layer, a shallow trap level is formed according to the first principle calculation.

Figure 8:
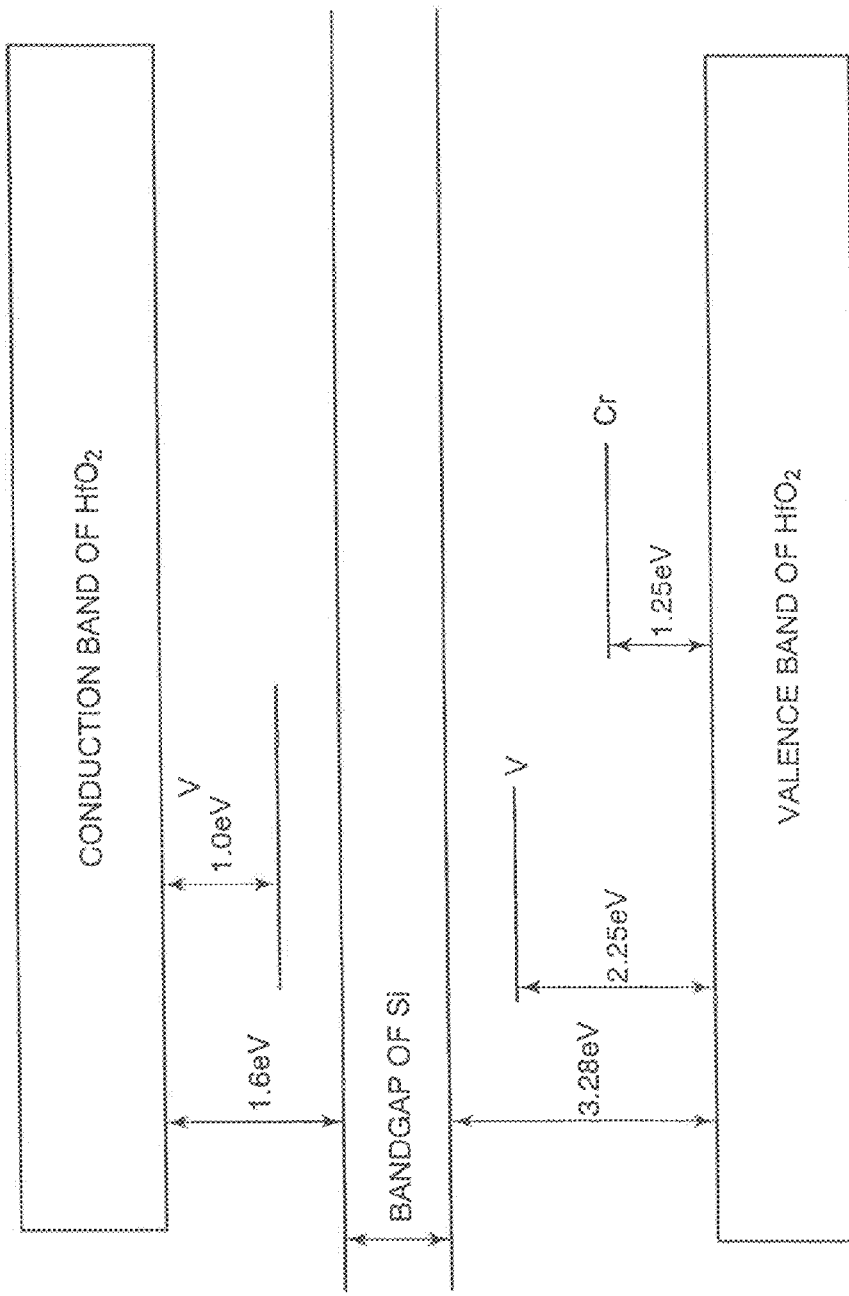
FIG. 8 is a diagram showing the assist levels of electrons and holes that are formed when V, Cr, or Mn is added to hafnia.
Figure 9:
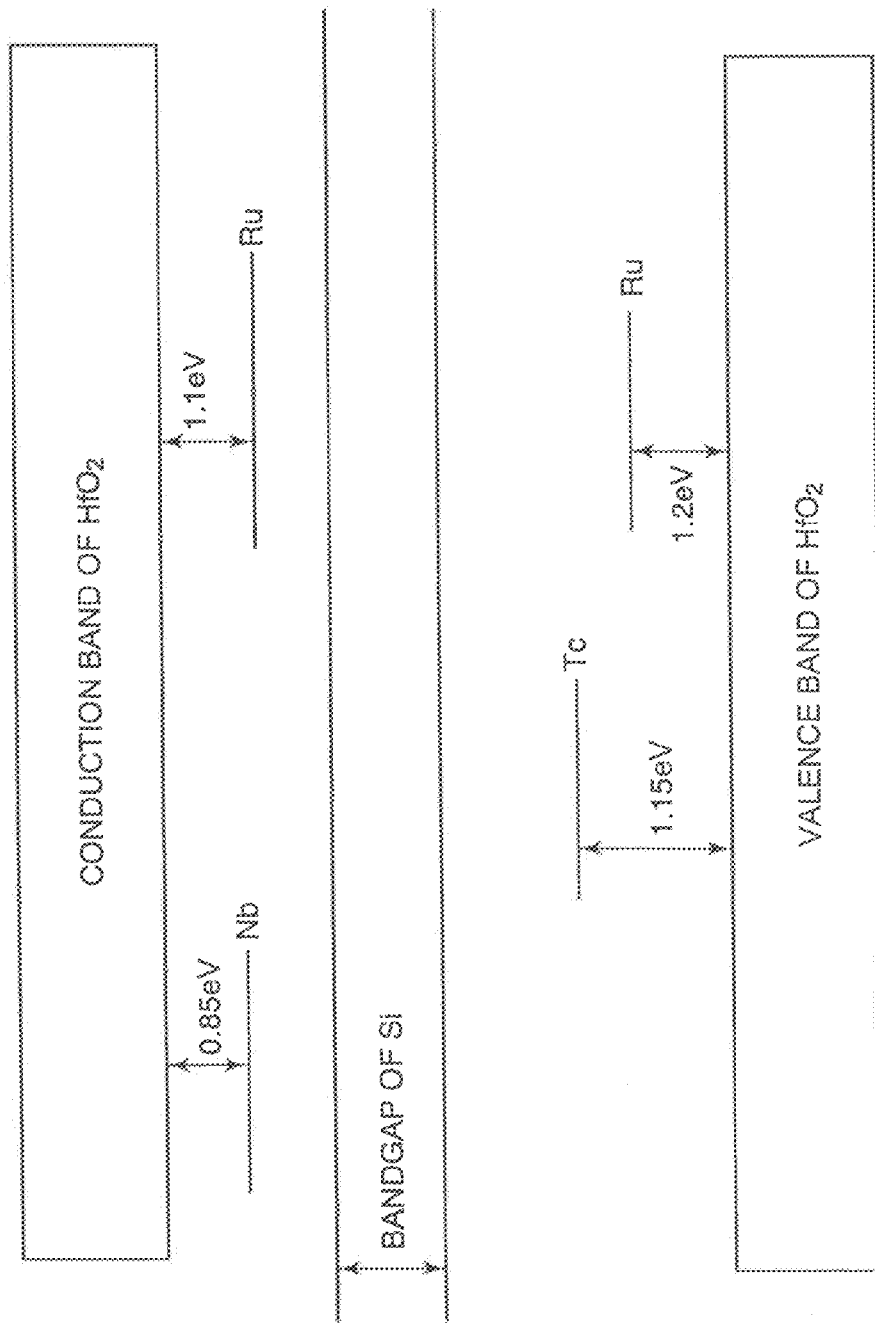
FIG. 9 is a diagram showing the assist levels of electrons and holes that are formed when Nb, Tc, or Ru is added to hafnia.
Figure 10:
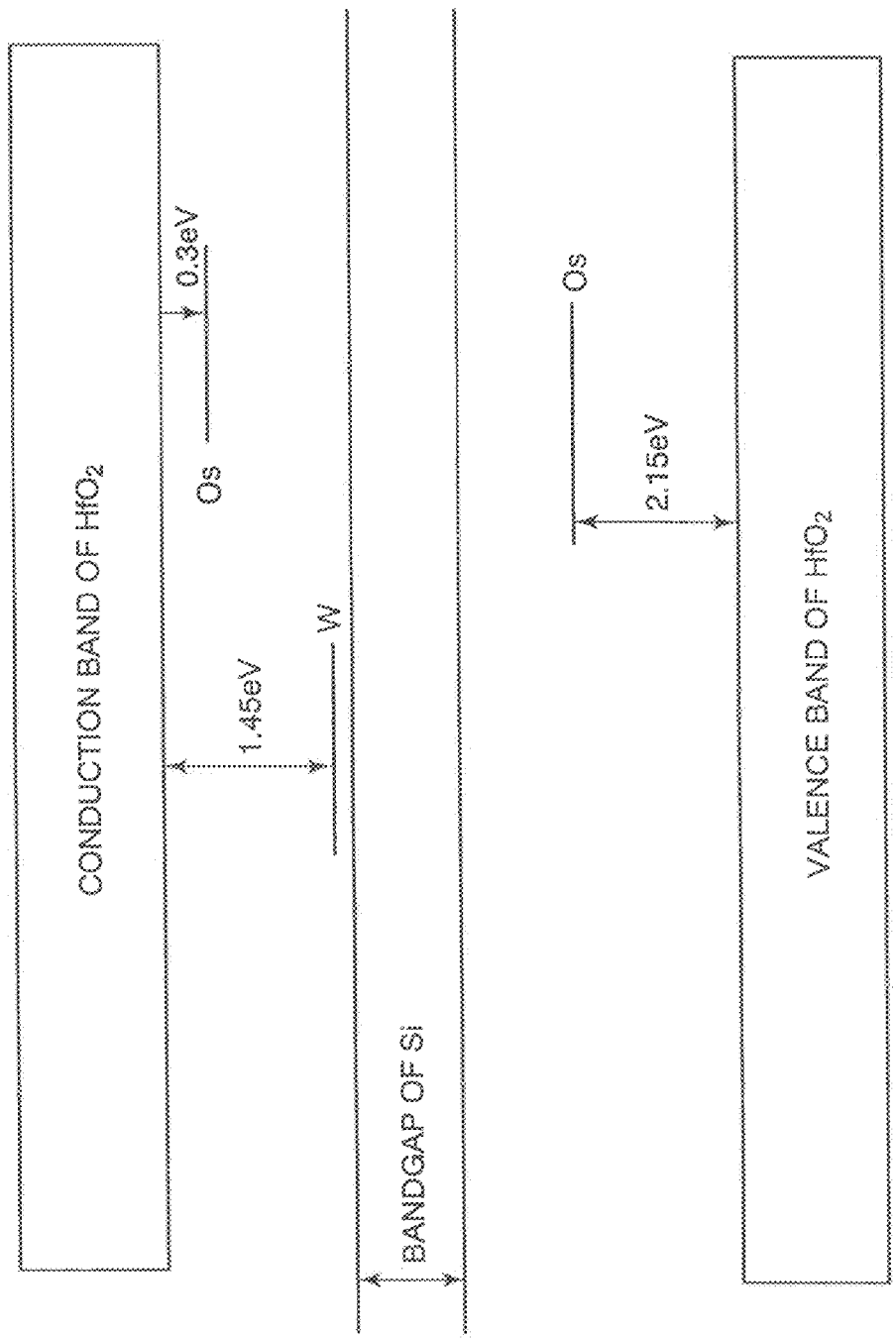
FIG. 10 is a diagram showing the assist levels of electrons and holes that are formed when W or Os is added to hafnia.

FIG. 8 shows trap levels formed by V, Cr, and Mn in hafnia. FIG. 9 shows trap levels formed by Nb, Tc, and Ru in hafnia. FIG. 10 shows trap levels formed by Ta, W, and Os in hafnia. As can be seen from FIGS. 8 through 10, the elements that form traps at shallow positions in the conduction band of hafnia are V, Nb, Ru, Ta, and Os. Those elements are suitable as elements to be added to p-MISFETs. The elements that form traps in positions near the valence band are V, Cr, Tc, Ru, and Os. Those elements are suitable as elements to be added to n-MISFETs.

Figure 11:
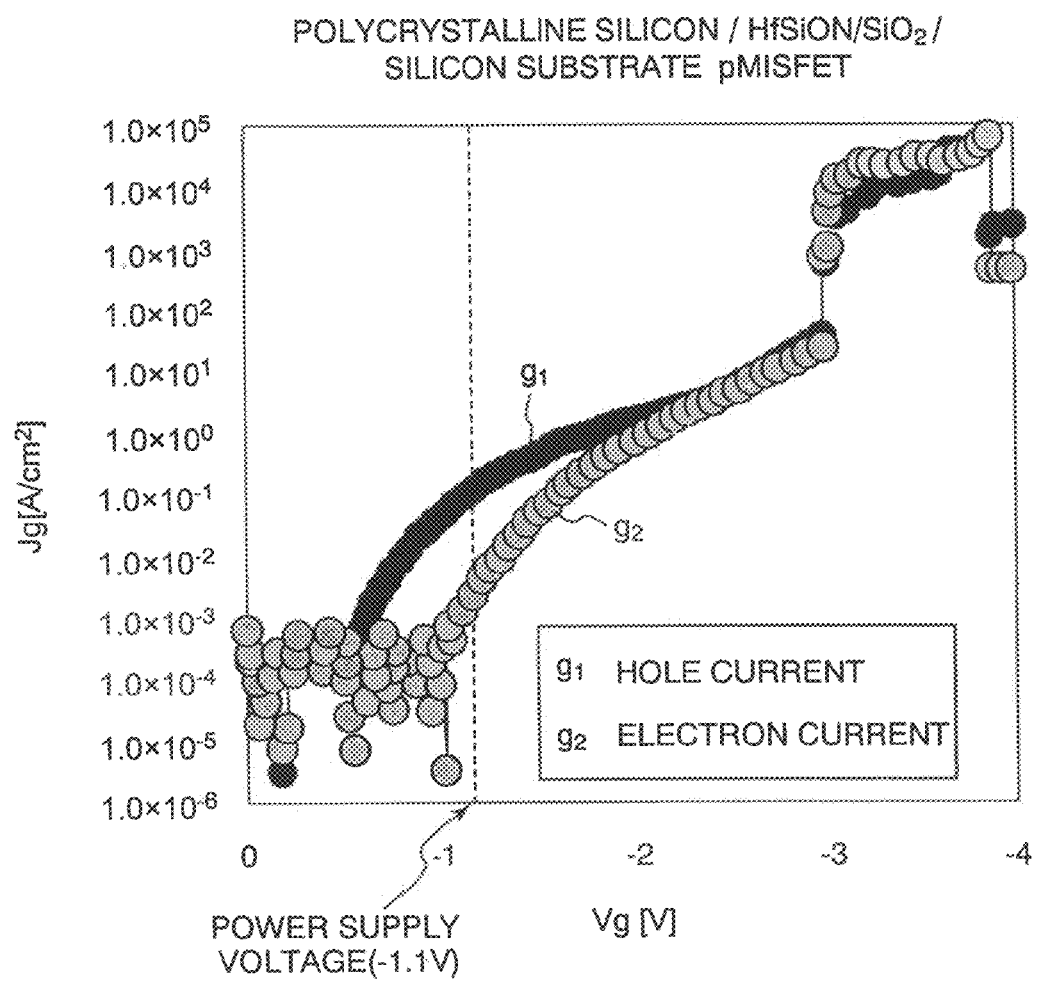
FIG. 11 is a graph showing the current components flowing in a p-MISFET in which the gate insulating film has a stack structure formed with a $SiO_2$ layer and a HfSiON layer.

The following is a description of an example of p-MISFET having Ru (ruthenium) as the element added to the gate insulating film 10 in which the layer thickness of the silicon oxide layer to be the interfacial oxide layer 11 is 1 nm, and the layer thickness of the nitrided hafnium silicate layer to be the high-dielectric layer 12 is 1.5 nm. FIG. 11 shows the results of measurement carried out on the current components flowing in the p-MISFET, with the current components being divided into a hole current (graph $g_1$) and an electron current (graph $g_2$). As can be seen from FIG. 11, in the neighborhood of a power supply voltage Vg of −1.1 V, the majority carriers form the hole current, and the minority carriers form the electron current.

The leakage current originating from the minority carriers (electrons) flowing in the gate insulating film having this stack structure is expressed as follows:

$$J = \frac{4\pi me}{h^3} \int_0^\infty \zeta(E_x) T^*(E_x) dE_x \tag{1}$$

$$\zeta(E_x) = \int_0^\infty \frac{dE_r}{1 + \exp[(E_r + E_x - E_F)/(k_B T)]} \tag{2}$$

where, e represents the elementary charge, m represents the mass of electrons in vacuum, h represents the Planck's constant, $k_B$ represents the Boltzmann's constant, T represents the temperature, E represents the energy of the electrons, $E_x$ (=$E-E_y$) represents the energy in the electron tunneling direction (the x-axis direction), $E_F$ represents the Fermi level of the semiconductor substrate, and $T^*(E_x)$ represents the effective tunneling probability of the electrons flowing in the gate insulating film. In the embodiment of the present invention, the trap level in the gate insulating film having a stack structure formed with different insulating layers is calculated.

Where the dielectric constants of the interfacial oxide layer 11 as the low-k layer and the high-dielectric layer 12 as the high-k layer are $\in_1$ and $\in_2$, and the voltages applied to the interfacial oxide layer 11 and the high-dielectric layer 12 are $V_1$ and $V_2$, respectively, different actual electric fields are applied to the respective insulating layers if the flux density is assumed to be fixed in the stack structure of insulating layers with different dielectric constants. With the actual electric fields applied to the interfacial oxide layer and the high-electric layer being $E_1$ and $E_2$, the following relationship is established:

$$\in_{ox} \times E_{ox} = \in_1 \times E_1 = \in_2 \times E_2 \tag{3}$$

where, $\in_{ox}$ (=3.9) is the dielectric constant of $SiO_2$. The actual electric fields are defined as $E_1 = V_1/T_1$ and $E_2 = V_2/T_2$, which satisfy the following equation:

$$\in_1 \times V_1/T_1 = \in_2 \times V_2/T_2 \tag{4}$$

As can be seen from the equation (3), the actual electric field of the interfacial oxide layer is stronger than that of the high-dielectric layer.

Since the voltage $V_2$ is applied to the high-dielectric layer, the assist level (the trap level) has the width of $V_2$ in terms of energy level. In this condition, however, the Fermi level $E_F$ of the semiconductor substrate is lower than the assist level. Therefore, the assist level does not affect the leakage current. Accordingly, in a low electric field, the leakage current becomes the same as the leakage current from the insulating films of the same stack structure without an assist level. The effective tunneling probability $T^*(E_x)$ in that case is expressed as:

$$T^*(E_x) = T_{FN}(\phi^*_{b1}, m^*_1, E_1) T_{FN}^{-1}(\phi^*_{b1} - V_1, m^*_1, E_1) T_{FN} (\phi^*_{b2}, m^*_2, E_2) T_{FN}^{-1}(\phi^*_{b2} - V_2, m^*_2, E_2) \tag{5}$$

where, $\phi_{b1}^*$ is $\phi_{b1} + E_F - E_x$, and $\phi_{b2}^*$ is $\phi_{b2} + E_F - E_x - V_1$, and $m_1^*$ and $m_2^*$ are the effective masses of electrons tunneling in the interfacial oxide layer and the high-dielectric layer, respectively. Also, $\phi_{b1}$ and $\phi_{b2}$ are the barrier heights of the interfacial oxide layer and the high-dielectric layer, respectively. The effective mass is 0.5 m, which is a typical value. Here, m is the mass of electrons in vacuum. Meanwhile, $T_{FN}$ represents the Fowler-Nordheim (F-N) tunneling probability, and, where $0 \leq E_x < \phi_b^*$, it is defined by the following equation (6):

$$T_{FN}(\phi_b^*, m^*, E) = \exp\left[-\frac{8\pi(2m^*)^{1/2}}{3heE} \phi_b^{*3/2}\right] \tag{6}$$

In a case where $\phi_b^* \leq E_x$, $T_{FN}$ is defined by the following equation (7):

$$T_{FN}(\phi_b^*, m^*, E) = 1 \tag{7}$$

Here, $m^*$ represents the effective mass of electrons tunneling in the tunnel insulating film, $\phi_b^*$ represents the effective barrier height of the tunnel insulating film, $E_F$ represents the Fermi level, $E_x$ represents the energy in the tunneling direction of electrons, e represents the elementary charge, h represents the Planck's constant, and $E_1$ and $E_2$ represent the actual electric fields in the interfacial oxide layer and the high-dielectric layer, respectively. The F-N tunneling is the minority carriers tunneling through a tilted conduction band of an insulating film.

When a high electric field $E_{ox}$ is applied to a gate insulating film having a stack structure with an assist level, the voltages to be applied to the respective layers are also high, because the electric field $E_{ox}$ is high. More specifically, a high voltage $V_1$ is applied to the interfacial oxide layer, and a voltage $V_2$ lower than the voltage $V_1$ is applied to the high-dielectric layer. Where the electric field $E_{ox}$ is high to a certain degree, a high voltage is applied to the interfacial oxide layer. Therefore, the lower edge $E_c$ of the conduction band of the high-dielectric layer becomes lower by $V_1$, and the assist level also becomes lower by $V_1$. As a result, the Fermi level $E_F$ of the semiconductor substrate overlaps with the height of the assist level. Electrons then start tunneling via the assist level. Accordingly, in a gate insulating film having a stack structure with an assist level, the assist level functions as the level to assist the minority carriers (electrons) in tunneling, and so-called TAT (Trap Assisted Tunneling) is caused. According to the mechanism of TAT, the probability P of electrons flowing via the assist level by virtue of the continuity of current density in a steady state satisfies the following equation (8):

$$P = p_1 \cdot (1-f) = p_2 \cdot f \tag{8}$$

where $p_1$ represents the probability of electrons tunneling from the semiconductor substrate to the assist level, $p_2$ represents the probability of electrons tunneling from the assist level to the charge storage film (the gate electrode in a MISFET), and f represents the probability of the assist level being occupied (1−f representing the probability of the assist level being unoccupied). Since f is equal to $p_1/(p_1+p_2)$, the following relationship is established:

$$P = 1/(1/p_1 + 1/p_2) \tag{9}$$

The probability of electrons not flowing via the assist level is represented by the product of $p_1$ and $p_2$, or $p_1 \cdot p_2$, which is smaller than the value expressed by the equation (9). Therefore, the leakage current via the assist level is larger than the leakage current not flowing via the assist level.

In a case where an assist level exists only in the high-dielectric layer in a gate insulating film having a stack structure formed with an interfacial oxide layer and the high-dielectric layer, the tunneling probability can be summed up as follows based on the positional relationship between the energy level Ex of tunneling electrons and $\phi_{T2}$:

$$P^* \begin{cases} P_L P_H & V_2 < \phi_{T2}^* \\ 1/[(P_L P_{H1}) + 1/P_{H2}] & 0 < \phi_{T2}^* \leq V_2 \\ P_L P_H & \phi_{T2}^* \leq 0 \end{cases}$$

In a case where electrons tunnel without an assist level, the tunneling probability is expressed by the product of probabilities of electrons tunneling through the high-dielectric layer and the interfacial oxide layer, and is the same as the value represented by the equation (5) where there is not an assist level. In cases where electrons tunnel via an assist level, the probabilities are expressed as follows:

$$P_L = T_{FN}(\phi^*_{b1}, m^*_1, E_1) T_{FN}^{-1}(\phi^*_{b1} - V_1, m^*_1, E_1)$$

$$P_{H1} = T_{FN}(\phi^*_{b2}, m^*_2, E_2) T_{FN}^{-1}(\phi^*_{T2}, m^*_2, E_2)$$

$$P_{H2} = T_{FN}(\phi_{T2}, m^*_2, E_2) T_{FN}^{-1}(\phi^*_{b2} - V_2, m^*_2, E_2)$$

Here, the following relationship is defined:

$$\phi_{T2}^* = \phi_{T2} - \phi_{b2}^*$$

In the calculation of leakage current, all the electrons entering the gate insulating film from the electrode are assumed to be captured by an assist level and be released from the assist level.

According to the above equations, the currents flowing in a case where there is not a trap and where there is a trap are calculated. As an example, the trap level and the injection level of electrons obtained when Ru is added to a high-dielectric layer of nitrided hafnium silicate are now described, with reference to a schematic band diagram. Here, the barrier height of electrons in the nitrided hafnium silicate is 1.6 eV, and the in-film trap level formed by the addition of Ru is approximately 1.1 eV. When a power supply voltage (=−1.1 V) is applied, a current flows via the trap.

Figure 12:
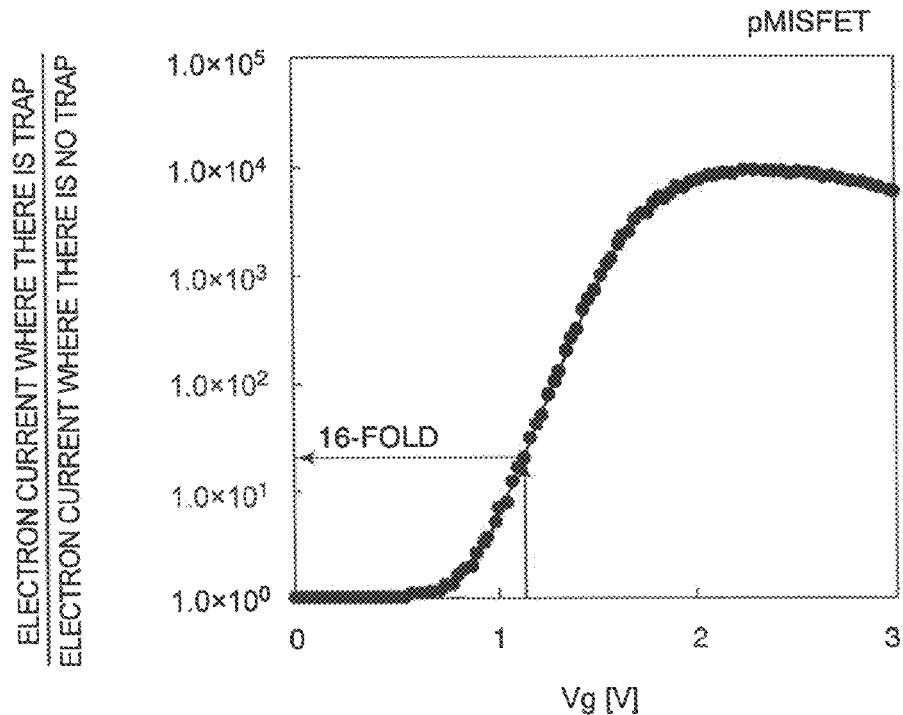
FIG. 12 is a graph showing the dependence of applied voltage on the ratio of the electron current observed where there is an electron trap to the electron current observed where there is not a trap in a p-MISFET.

FIG. 12 shows the dependence of the gate voltage Vg on the ratio of the electron current obtained where there is a trap to the electron current obtained where there is not a trap in a gate insulating film having a stack structure. The dielectric constant $\in_{HK}$ of the high-dielectric layer (a nitrided hafnium silicate layer) is 12, the dielectric constant $\in_{IL}$ of the interfacial oxide layer (a SiO$_2$ layer) is 3.9, the barrier height $\phi_{HK}$ of the high-dielectric layer is 1.6 eV, the trap level $\phi_{trap}$ in the high-dielectric layer is 1.1 eV, and the layer thicknesses $T_{HK}$ and $T_{IL}$ of the high-dielectric layer and the interfacial oxide layer are 1.5 nm and 1 nm, respectively. As can be seen from FIG. 12, when a power supply voltage (=1.1 V) is applied to the gate insulating film having the stack structure, the electron current increases approximately fivefold, because of the existence of a trap.

Figure 13:
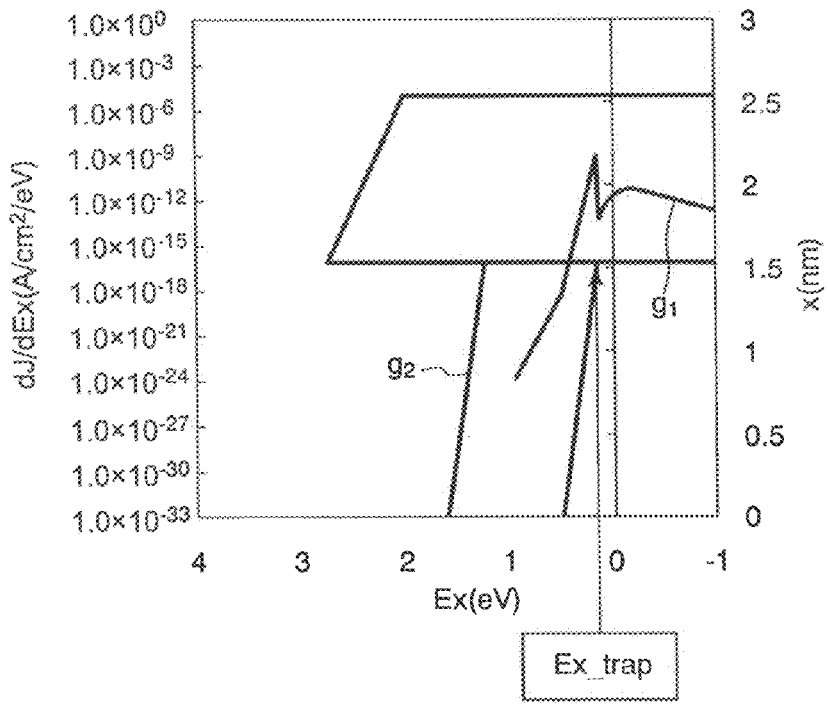
FIG. 13 is a graph showing the relationship between $E_x$ and $dJ/dE_x$.

Next, the preferred position of a trap is described in the film thickness direction. A tunneling current can be expressed by integrating the number $dJ/dE_x$ of electrons tunneling in the insulating film from the energy level $E_x$ of the electrode in unit area and unit time with the energy Ex. The relationship between $E_x$ and $dJ/dE_x$ is represented by the graph $g_1$ in FIG. 13. In FIG. 13, 0 eV on the abscissa axis indicates the Fermi level of electrons at the gate electrode, and the graph $g_2$ indicates the band diagram of the gate insulating film. The tunneling probability becomes higher, as $E_x$ becomes higher. However, the number of electrons in the tunneling direction in the gate electrode becomes smaller, as $E_x$ becomes higher. Therefore, the energy level $E_x$ at which the current becomes largest is determined by the trade-off between those values. In a case where there is an assist level, there is a maximum value ($E_x$ to 0.14 eV), as well as the maximum value ($E_x$=0) observed when there is not an assist level. This is because electrons are conducted at $E_x$ (up to 0.14 eV) according to the TAT mechanism, and the tunneling probability becomes higher accordingly, though the number of electrons in the tunneling direction becomes smaller as $E_x$ becomes higher. Here, the trap position $X_{trap}$ in the film thickness direction is determined from the point where Ex_trap at which the current becomes largest when the power supply voltage is applied intersects with the trap level ($\phi_{trap}$=1.1 eV) in the gate insulating film.

Figure 14:
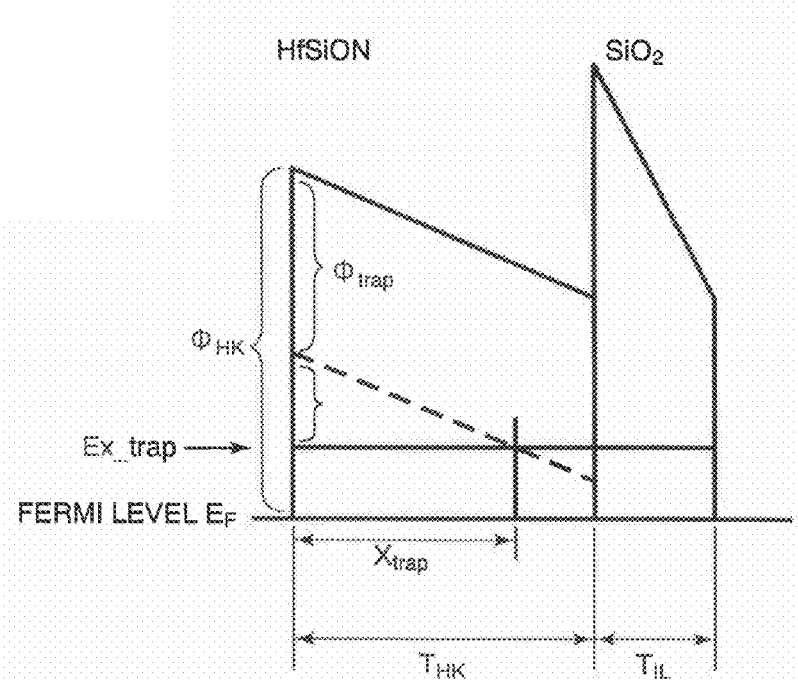
FIG. 14 is a schematic view showing the relationship between the trap level and the electron injection level with a power supply voltage.

Referring now to FIG. 14, the calculation of the trap position $X_{trap}$ from the gate electrode in the film thickness direction is described. Being divided by the reciprocals of the dielectric constants $\in_{HK}$ and $\in_{IL}$, the electric fields $E_{HK}$ and $E_{IL}$ applied to the high-dielectric layer and the interfacial oxide layer are expressed by the following equation:

$$\in_{IL} \cdot E_{IL} = \in_{HK} \times E_{HK} \quad (a)$$

The voltage $V_{HK}$ applied to the high-dielectric layer and the voltage $V_{IL}$ applied to the interfacial oxide layer are expressed as:

$$V_{HK} = E_{HK} \times T_{HK} \quad (b)$$

$$V_{IL} = E_{IL} \times T_{IL} \quad (c)$$

The power supply voltage Vg is expressed as:

$$Vg = V_{HK} + V_{IL}$$

As can be seen from FIG. 14, the electric field $E_{HK}$ in the high-dielectric layer is expressed as:

$$E_{HK} = (\Phi_{HK} - \phi_{trap} - Ex\_trap)/X_{trap} \quad (d)$$

According to the equations (a) through (d), the trap position $X_{trap}$ is expressed as:

$$X_{trap} = (\Phi_{HK} - \Phi_{trap} - Ex\_trap) \times (T_{HK} \times \in_{IL} + T_{IL} \times \in_{HK})/(Vg \times \in_{IL}) \quad (e)$$

This trap position $X_{trap}$ represents the peak position of the trap distribution.

As a result of the calculation of the trap position $X_{trap}$ described above, it becomes apparent that the trap position $X_{trap}$ is 1.5 nm and a trap should exist in the vicinity of the interface between the interfacial oxide layer and the high-dielectric layer, in a case where the layer thickness of the interfacial oxide layer of SiO$_2$ is 1 nm, the layer thickness of the high-dielectric layer of nitrided hafnium silicate (Hf-SiON) is 1.5 nm, and Ru is added to the high-dielectric layer.

Figure 15:
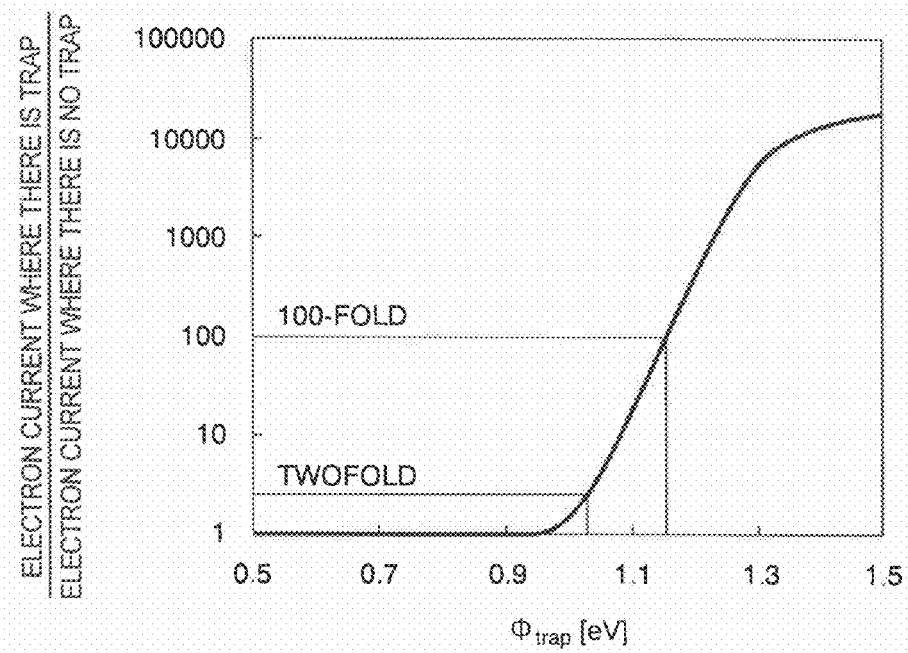
FIG. 15 is a graph showing the dependence of the trap level on the ratio of the electron current observed where there is a trap to the electron current observed where there is not a trap in a p-MISFET.

FIG. 15 shows the dependence of the trap level on the ratio of the electron current observed where there is a trap to the electron current observed where there is not a trap in a gate insulating film having a stack structure formed with a 1-nm thick interfacial oxide layer and a 1.5-nm thick high-dielectric layer of nitrided hafnium silicate. As can be seen from FIG. 15, the current increases, as the trap level becomes deeper. With the device performance being taken into consideration, however, a large increase in leakage current is not preferable in view of power consumption.

FIG. 11, which has already been described, shows the results of an experiment carried out to examine the leakage current of a p-MISFET that has a gate insulating film having a stack structure formed with a 2.5-nm thick high-dielectric layer of HfSiON and a 1.0-nm thick interfacial oxide layer of SiO$_2$. In this experiment, the electron current (graph $g_2$) and the hole current (graph $g_1$) are separated from each other by a carrier separation technique. As can be seen from FIG. 11, in the neighborhood of the power supply voltage (=−1.1 V), the hole current is the majority carriers, and the electron current is the minority carriers. Accordingly, the entire leakage current is substantially determined by the hole current. Also, as can be seen from FIG. 11, the electron current is substantially smaller than the hole current by double-digits. Therefore, even if the electron current flowing by virtue of a trap increases by two-digits, the leakage current increases only by the same amount as the majority carriers, and the increase in the electron current does not greatly affect the entire leakage current. Therefore, it is necessary to limit such a trap level region as to be sufficient to modulate the shape parameter β of Weibull plots and not to increase the leakage current by too large an amount. This limitation is preferably set on such a trap level as to increase the electron current twofold to hundredfold in the p-MISFET.

Figure 16:
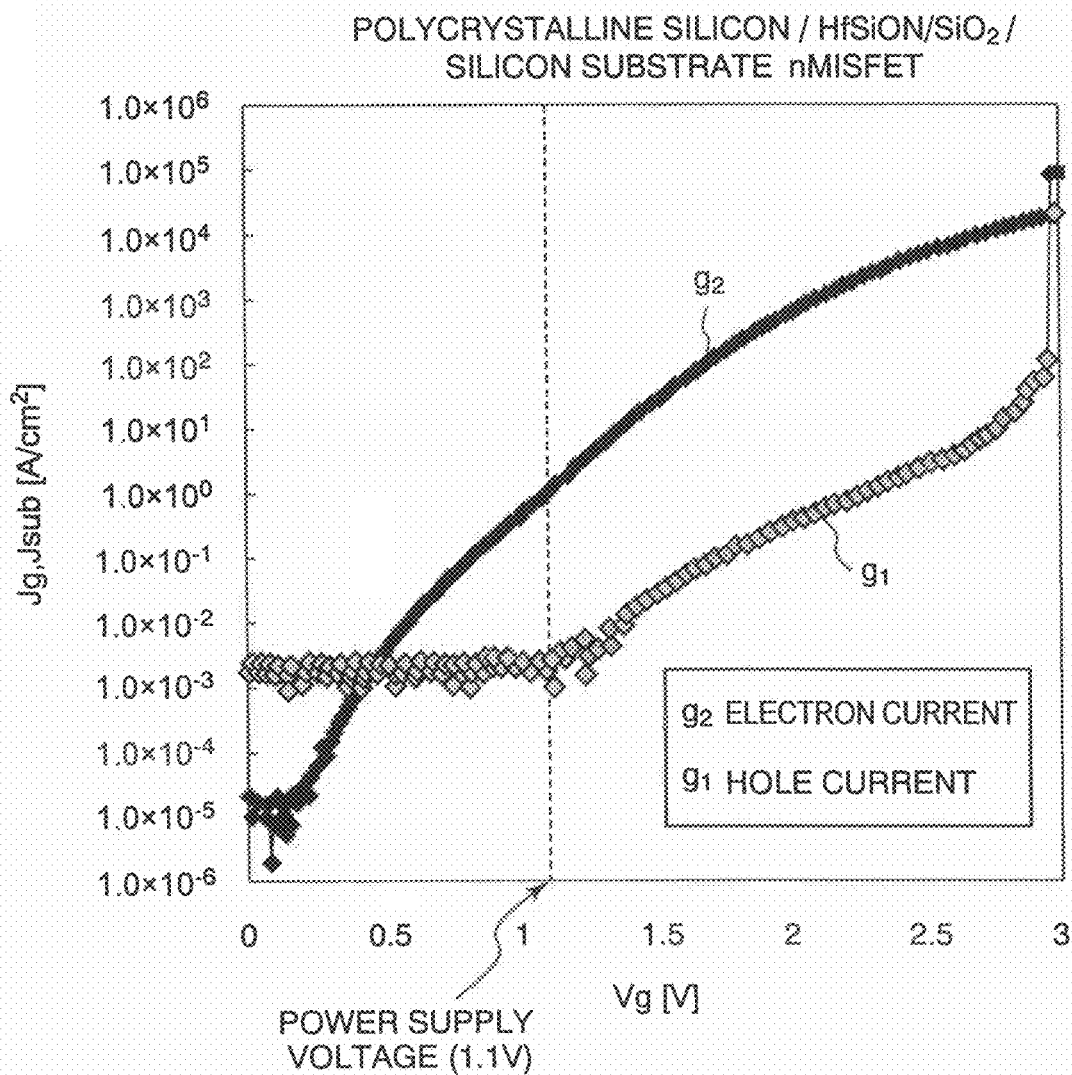
FIG. 16 is a graph showing the current components flowing in an n-MISFET in which the gate insulating film has a stack structure formed with a SiO₂ layer and a HfSiON layer.

FIG. 16 shows the results of an experiment carried out to examine the leakage current of an n-MISFET that has a gate insulating film having a stack structure formed with a 2.5-nm thick high-dielectric layer of HfSiON and a 1.0-nm thick interfacial oxide layer. In this experiment, the hole current (graph $g_1$) and the electron current (graph $g_2$) are separated from each other by a carrier separation technique. As can be seen from FIG. 16, in the neighborhood of the power supply voltage (=1.1 V), the electron current is the majority carriers, and the hole current is the minority carriers. Accordingly, the entire leakage current is substantially determined by the electron current. Also, as can be seen from FIG. 16, the hole current is smaller than the electron current by almost three-digits in the power supply voltage (=1.1 V). Therefore, even if the hole current flowing by virtue of a trap increases by three-digits in the n MISFET, the leakage current increases only by the same amount as the majority carriers, and the increase in the hole current does not greatly affect the entire leakage current. Therefore, it is necessary to limit such a trap level region as to be sufficient to modulate the shape parameter β of the Weibull distribution and not to increase the leakage current by too large an amount. This limitation is preferably set on such a trap level as to increase the hole current twofold to thousandfold in the n-MISFET.

Figure 17:
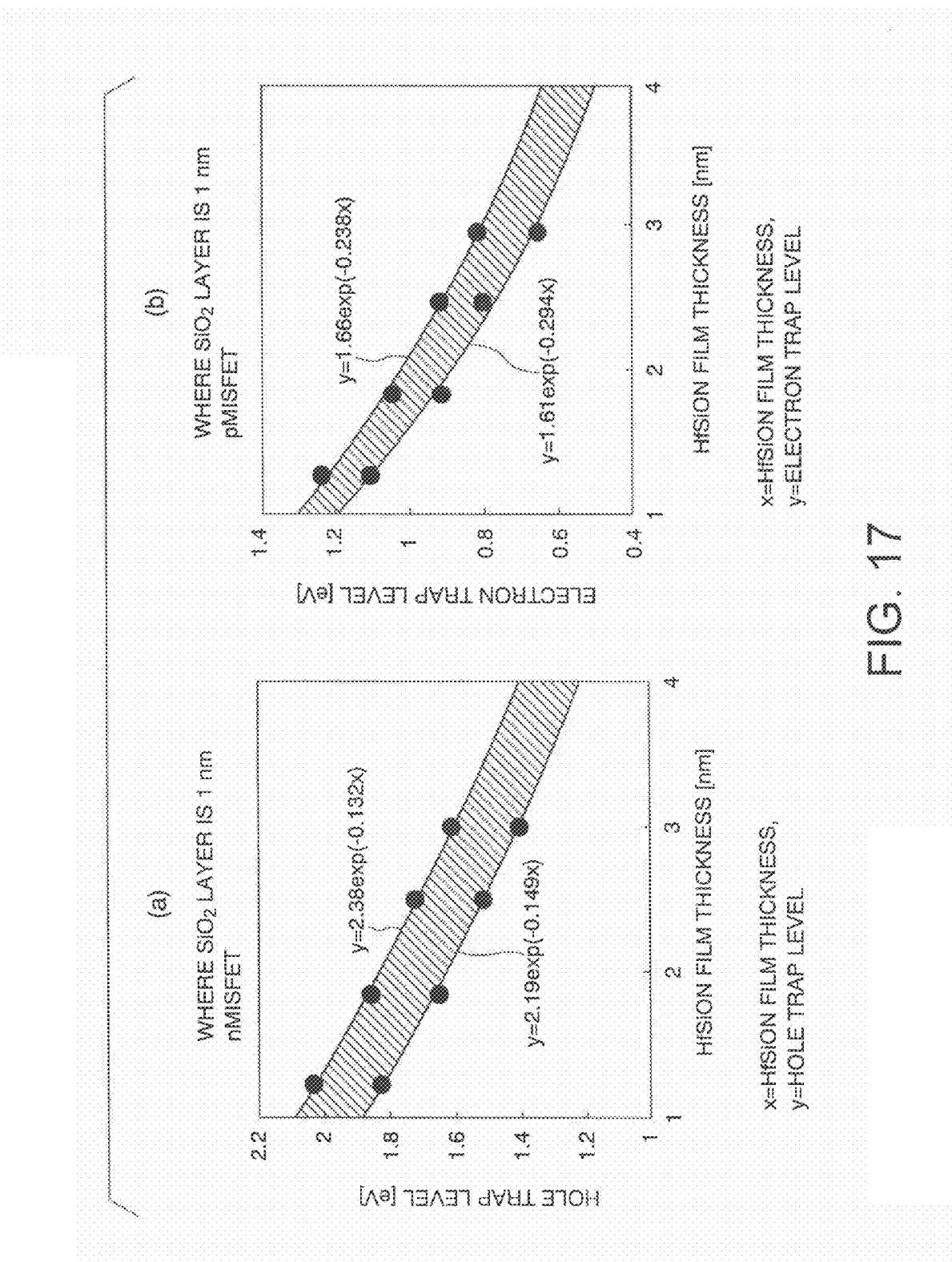
FIGS. 17(a) and 17(b) are graphs showing the preferred ranges of trap levels in an n-MISFET and a p-MISFET.

FIGS. 17($a$) and 17($b$) show the results of calculations of desired trap level regions in cases where the layer thickness of the interfacial oxide layer of $SiO_2$ is fixed at 1 nm, and the layer thickness of the high-dielectric layer of HfSiON is varied in each of an n-MISFET and a p-MISFET. In the n-MISFET, the region interposed between the two functions, y=1.29 exp (−0.149x) and y=2.38 exp (−0.132x), is the desired trap level region, where x represents the layer thickness of the HfSiON layer, and y represents the hole trap level (FIG. 17($a$)). In the p-MISFET, the region interposed between the two functions, y=1.61 exp (−0.294x) and y=1.66 exp (−0.238x), is the desired trap level region, where x represents the layer thickness of the HfSiON layer, and y represents the electron trap level (FIG. 17($b$)). Here, exp( ) represents the exponent function of e, where e represents the base of natural logarithm. Those regions with the respective film thicknesses are calculated by measuring the trap level dependence of the increases in current by the traps shown in FIG. 15 in the n-MISFET and p-MISFET.

Figure 18:
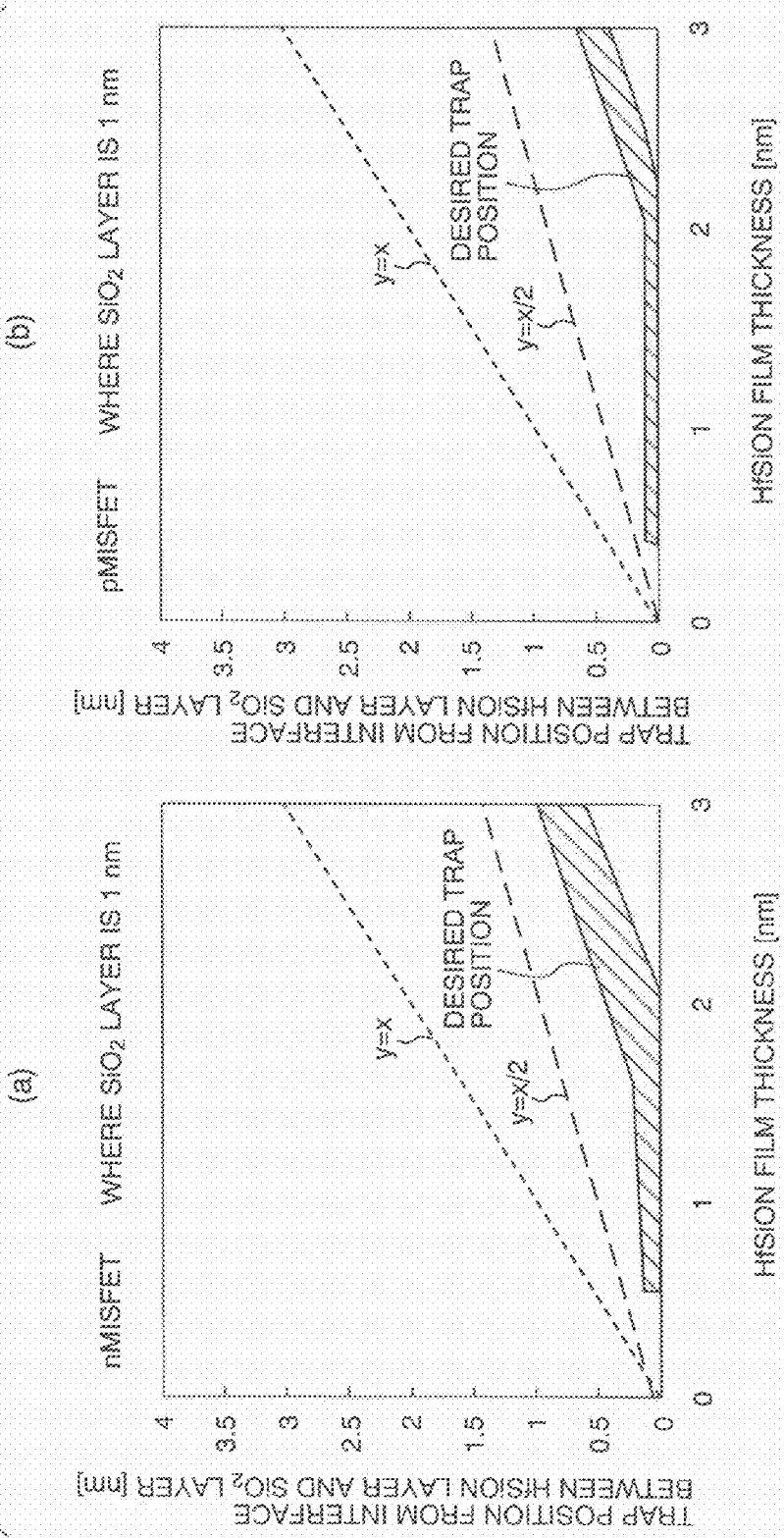
FIGS. 18(a) and 18(b) are graphs showing the preferred ranges of trap positions in an n-MISFET and a p-MISFET.

FIGS. 18($a$) and 18($b$) show the results of calculations of dependence of the trap position from the interface between the HfSiON layer and the $SiO_2$ layer on the layer thickness of the HfSiON layer in a case where the layer thickness of the interfacial oxide layer of $SiO_2$ is 1 nm, and the layer thickness of the high-dielectric layer of HfSiON is varied in each of the n-MISFET and p-MISFET. As can be seen from FIGS. 18($a$) and 18($b$), the trap positions should preferably be located in the vicinity of the interface of the HfSiON layer and the $SiO_2$ layer (as indicated by the shadowed areas in FIGS. 18($a$) and 18($b$)).

Next, the amount of the element to be added to the high-dielectric layer is described. In the following example, a $HfO_2$ layer is used as the high-dielectric layer, and Ru is the element to be added. Where the lattice constant of $HfO_2$ is represented by "a", four sets of $HfO_2$ can exist in an a×a×a unit. Accordingly, thirty-two Hf atoms and sixty-four oxygen atoms exist in a 2a×2a×2a unit. Where one or more Ru atoms are introduced into the 2a×2a×2a unit, and Hf is substituted by Ru, interactions with adjacent additional materials are caused, and a metallic band (a level that can cause "hopping") is formed. As a result, a problem is caused in the insulating properties of the high-dielectric layer. The Ru concentration observed where one Ru atom is introduced into a 2a×2a×2a unit, and Hf is substituted by Ru, is 1/(32+64)×100=1.04 atomic %. Therefore, if the concentration of the added element becomes higher than 1 atomic %, a problem is caused in the insulating properties of the high-dielectric layer.

However, in a case where one Ru atom is added to a 3a×3a×3a unit, Ru as the additional element is completely localized, and no interactions with adjacent additional materials are caused. In this 3a×3a×3a unit, 108($3^3$×4) Hf atoms and 216 oxygen atoms are introduced. Accordingly, the concentration of the additional element Ru that is completely localized is 1/(108+216)×100=0.31 atomic %. To maintain excellent insulating properties of the high-dielectric layer even when an additional element is added to the high-dielectric layer, the upper limit of the concentration of the additional element is 0.31 atomic %. This upper limit does not vary with the material of the additional element, but varies with the material of the high-dielectric layer. In a case where a $LaAlO_3$ layer is used as the high-dielectric layer in a later described embodiment, the upper limit of the additional element concentration is 1/230×100=0.43 atomic % through the same calculation as above. The lower limit of the additional element concentration is the value observed where one atom of an additional element is introduced into a MISFET, and is $1×10^{-16}$ atomic %. Since the concentration of the additional element varies with the material of the high-dielectric layer, the amount of the additional element is measured in terms of density. The density where one Ru atom is added to a 3a×3a×3a unit is 1/(3a×3a×3a)=$2.96×10^{20}$ $cm^{-3}$. Therefore, to maintain excellent insulating properties in the high-dielectric layer even after an additional element is added to the high-dielectric layer, the upper limit of the additional element density is $2.96×10^{20}$ $cm^{-3}$. Also, the lower limit of the additional element density is $1×10^{15}$ $cm^{-3}$. This lower limit is the value equivalent to $1×10^{-16}$ atomic %, which is the lower limit of the concentration.

To avoid metal diffusion from the gate insulating film, JP-A 2005-183422 (KOKAI) discloses a technique of adding a metal element of W (tungsten), Mo (molybdenum), Cr (chromium), V (vanadium), Nb (niobium), or Ta (tantalum) at a concentration of 5 atomic % or lower to the gate insulating film. However, in a case where a metal element of 1 atomic % or higher is added, as described above, the gate insulating film is metallized, and ceases functioning as an insulating film. JP-A 2005-183422 (KOKAI) does not disclose this fact, and does not even imply it.

Figure 19:
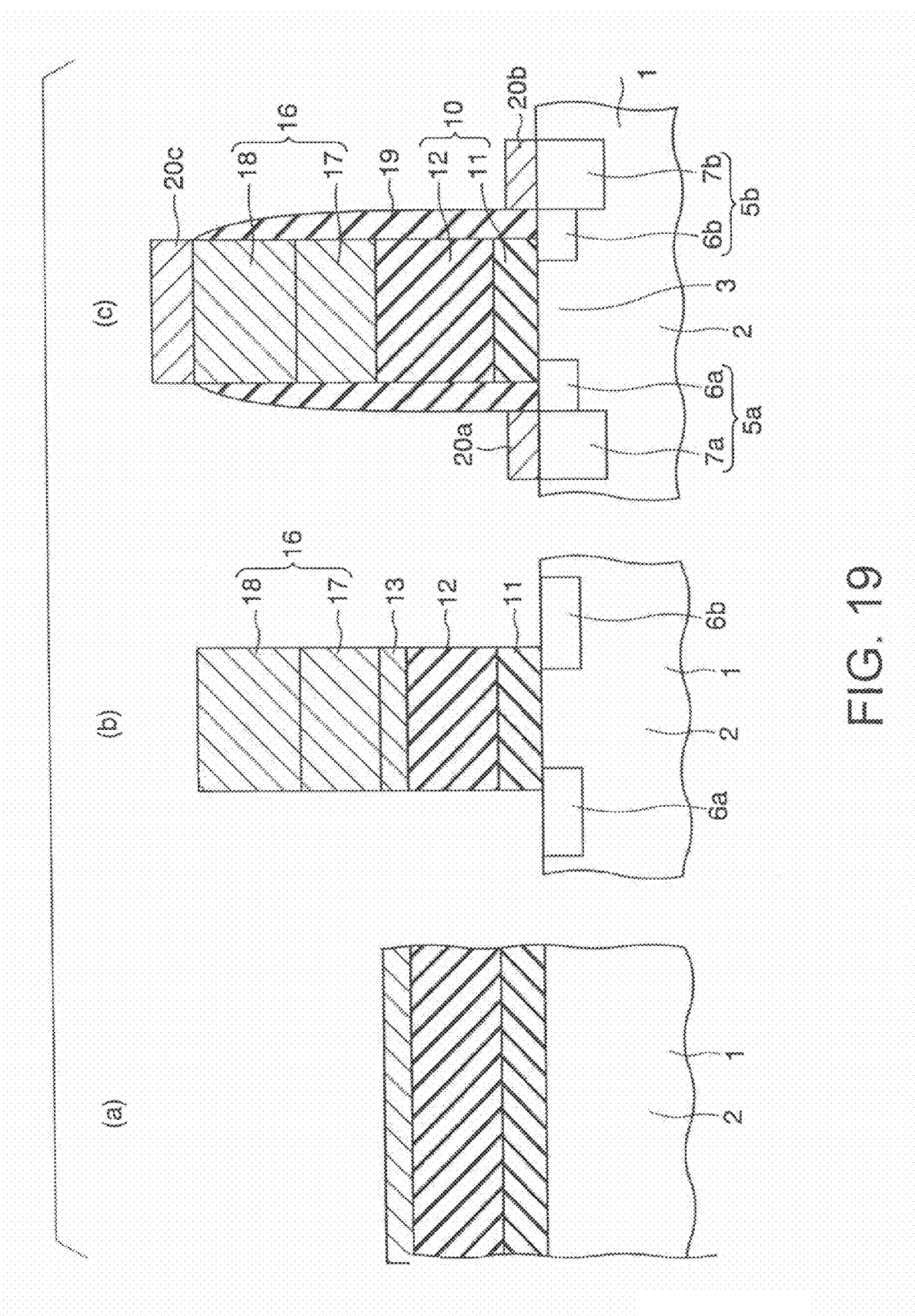
FIGS. 19(a) through 19(c) are cross-sectional views illustrating the procedures for manufacturing a MISFET of the first embodiment.

Next, a method for manufacturing the semiconductor device of this embodiment is described. FIGS. 19($a$) through 19($c$) are cross-sectional views illustrating the procedures for manufacturing the semiconductor device of this embodiment.

First, as shown in FIG. 19($a$), a silicon oxide layer to be the interfacial oxide layer of 0.6 nm to 1.5 nm in thickness is formed through thermal oxidation or steam burning oxidation on the semiconductor region (a semiconductor region made of silicon, for example) 2 of the semiconductor substrate 1. A hafnium silicate (HfSiO) layer of 1 nm to 3 nm in thickness is deposited by CVD (Chemical Vapor Deposition), ALD (Atomic Layer Deposition), or sputtering. Nitrogen is then introduced into the hafnium silicate (HfSiO) layer through plasma nitridation or ammonia nitridation or the like, so as to form a nitrided hafnium silicate (HfSiON) layer 12. The amount of nitrogen introduced here is the smallest necessary amount that does not cause phase separation or crystallization in the nitrided hafnium silicate layer 12. A Ru layer 13 is then deposited by sputtering or ALD (FIG. 19(a)). The deposition of the Ru layer 13 is performed to add (or introduce) Ru into the HfSiON layer 12 during the later described heating process. The introduction of Ru into the hafnium silicate layer 12 may be performed by ion implantation, instead of the deposition of the Ru layer 13. The amount of Ru to be added ranges from $1 \times 10^{15}$ cm$^{-3}$ to $2.96 \times 10^{20}$ cm$^{-3}$ in density.

A metal film 7 made of TiN or TaC or the like of 2 nm to 50 nm in thickness is then deposited on the Ru layer 13, as shown in FIG. 19(b). A polycrystalline silicon film 18 that is 10 nm to 1 μm in thickness and has impurities added thereto is then deposited on the metal film 7. Selective etching is then performed on the polycrystalline silicon film 18, the metal film 17, the Ru layer 13, the nitrided hafnium silicate layer 12, and the silicon oxide layer 11 by anisotropic etching such as RIE (Reactive Ion Etching), thereby forming a gate structure. The metal film 17 and the polycrystalline silicon film 18 in this gate structure form the gate electrode 16. With this gate structure serving as a mask, ion implantation is performed to form impurity layers 6a and 6b with a small junction depth (FIG. 19(b)).

After an insulating film such as a silicon nitride film is deposited on the entire surface, etchback is performed to form the gate sidewall 19 on the side portions of the gate structure, as shown in FIG. 19(c). With the gate structure and the gate sidewall 19 serving as masks, ion implantation is performed to form impurity layers 7a and 7b having impurities injected thereto at higher concentration than in the impurity layers 6a and 6b. A heating process is then performed to activate the impurities injected into those impurity layers. The impurity layer 6a and the impurity layer 7a form the source region 5a, and the impurity layer 6b and the impurity layer 7b form the drain region 5b. Through this heating process for activation, the Ru atoms in the Ru layer 13 diffuse into the nitrided hafnium silicate layer 12, which turns into a Ru-added nitrided hafnium silicate layer 12. In this embodiment, the heating process to diffuse Ru into the nitrided hafnium silicate layer 12 is performed through the heating process to activate the impurity layers 6a, 6b, 7a, and 7b, but may also be performed through a heating process to activate the impurities in the polycrystalline silicon film 18 forming the gate electrode 16. Other than those heating processes, an additional heating process may be performed. Through this heating process, the Ru atoms in the Ru layer 13 diffuse into the nitrided hafnium silicate layer 12, with a distribution depending on the heating process conditions. Here, the Ru atoms preferentially substitute the Hf atoms in the nitrided hafnium silicate layer 12, and do not diffuse into the silicon oxide layer 11. The silicon oxide layer 11 and the Ru-added nitrided hafnium silicate layer 12 form the gate insulating film 10.

Thereafter, the metal silicide 20 is formed on the gate electrode 16 and the source and drain regions 5a and 5b by a known technique, thereby completing the MISFET of this embodiment illustrated in FIG. 7.

An additional element may be added to the high-dielectric layer by a method other than the above described methods. More specifically, a high-dielectric layer such as a nitrided hafnium silicate layer is deposited by CVD, ALD, or sputtering, and a gate electrode (the metal film 17 and the polycrystalline silicon film 18) is then deposited. After that, a layer of an additional element is deposited on the gate electrode by CVD, ALD, or sputtering, so as to diffuse the additional element into the insulating film through a heating process performed in a later stage.

Alternatively, an additional element may be deposited by ALD or sputtering during the deposition of a high-dielectric layer of nitrided hafnium silicate or the like by ALD or sputtering. After that, a nitrided hafnium silicate layer is again deposited by ALD or sputtering, so as to introduce the additional element into the high-dielectric layer.

Alternatively, after an interfacial oxide layer of $SiO_2$ is deposited (or formed by thermal oxidation) on the silicon substrate, a layer of an additional element is deposited on the interfacial oxide layer by ALD, CVD, or sputtering, and a high-dielectric layer of nitrided hafnium silicate or the like is deposited on the additional element layer by ALD, CVD, or sputtering. The additional element can be diffused into the high-dielectric layer by a heating process performed in a later stage.

As described above, in accordance with this embodiment, an additional element is added to the high-dielectric layer, so that excellent insulating properties can be maintained in the high-dielectric layer, and a trap can be formed in the high-dielectric layer. Accordingly, the ratio of the minority carriers to the majority carriers can be made higher. With this arrangement, the shape parameter β of the Weibull distribution can be made greater without an increase in leakage current, and the TDDB lifetime can be greatly improved.

Although the interfacial oxide layer is a silicon oxide layer in this embodiment, it may be a silicon oxynitride layer.

Also, instead of nitrided hafnium silicate, a hafnium oxide such as hafnia, hafnium silicate, or hafnium aluminate can be used for the high-dielectric layer in this embodiment.

In this embodiment, nitrided hafnium silicate is used as the high-dielectric layer, and Ru is used as the additional material. However, it is also possible to use a high-dielectric layer made of an oxide containing Zr having substantially the same properties as Hf. As for the additional element, it is possible to use Nb, Cr, Os, V, Tc, or Ta, instead of Ru. Although this embodiment is applied to a p-MISFET, it is also possible to apply this embodiment to an n-MISFET.

(Second Embodiment)

Figure 20:
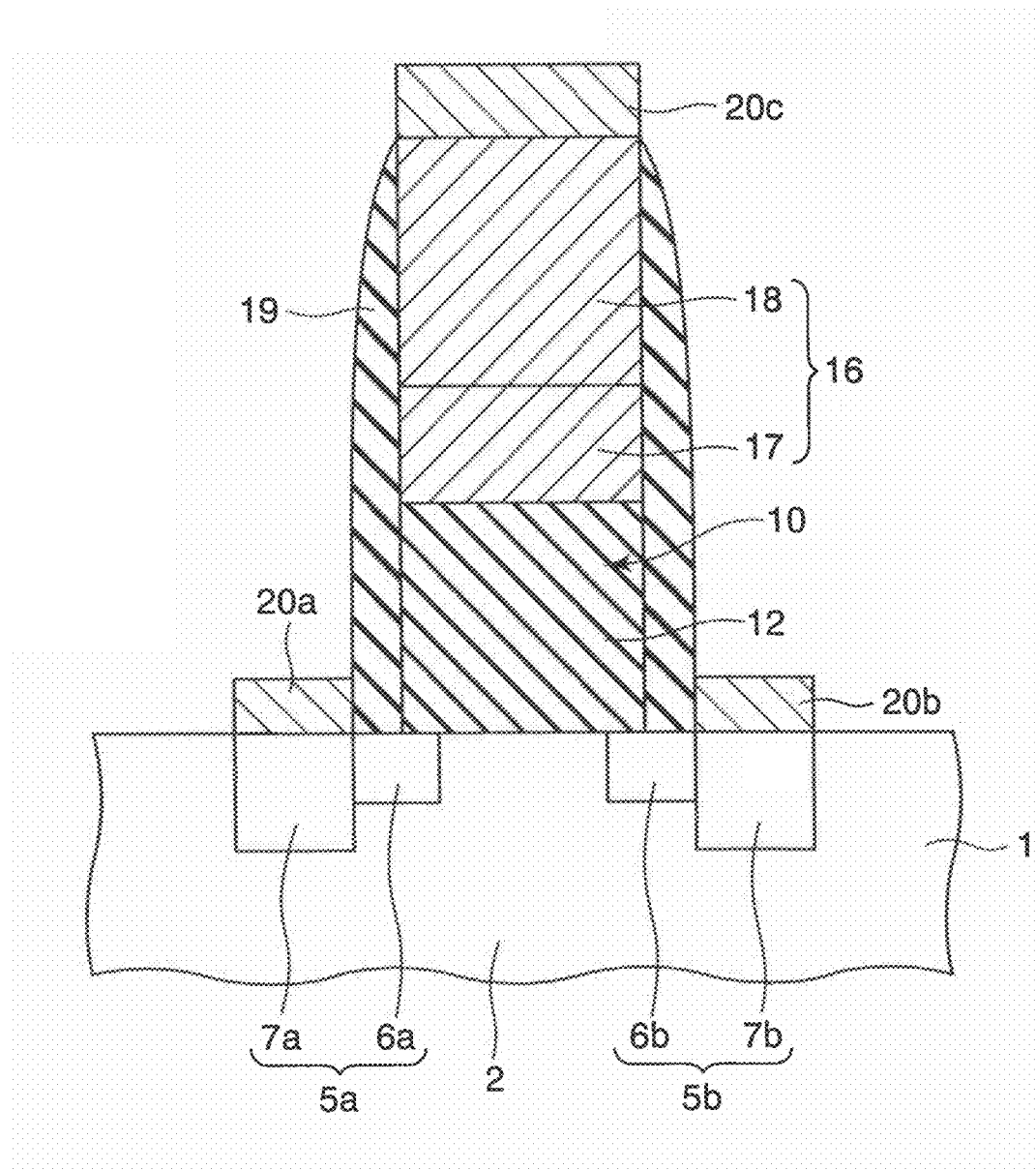
FIG. 20 is a cross-sectional view of a semiconductor device according to a second embodiment of the present invention.

FIG. 20 shows a semiconductor device according to a second embodiment. The semiconductor device of this embodiment is the same as the semiconductor device of the first embodiment illustrated in FIG. 7, except that the interfacial oxide layer 11 is removed, and the gate insulating film 10 is formed only with the high-dielectric layer 12. The semiconductor device of this embodiment can be used in a logic circuit. The semiconductor device having this structure includes: the source region 5a and the drain region 5b formed at a distance from each other in the semiconductor region 2 of the semiconductor substrate 1; the gate insulating film 10 that is formed with the high-dielectric layer 12 provided on the portion of the semiconductor region 2 to be the channel 3 located between the source region 5a and the drain region 5b; and the gate electrode 16 placed on the gate insulating film 10. The source region 5a includes the impurity layer 6a with a small junction depth and the impurity layer 7a with a large junction depth. The drain region 5b includes the impurity layer 6b with a small junction depth and the impurity layer 7b with a large junction depth. The gate electrode 16 includes the metal film 17 placed on the gate insulating film 10, and the polycrystalline silicon film 18 placed on the metal film 17. The gate sidewall 19 made of an insulating material (such as silicon nitride) is provided at the side portions of the gate electrode 16. The metal silicide layers 20a, 20b, and 20c are formed on the source region 5a, the drain region 5b, and the polycrystalline silicon film 18 of the gate electrode 16, respectively.

In the semiconductor device of this embodiment, at least one element selected from the group consisting of Ru, Cr, Os, V, Tc, and Nb is added to the high-dielectric layer 12, and the density of the additional element is in the range of $1 \times 10^{15}$ $cm^{-3}$ to $2.96 \times 10^{20}$ $cm^{-3}$, as in the first embodiment.

Figure 21:
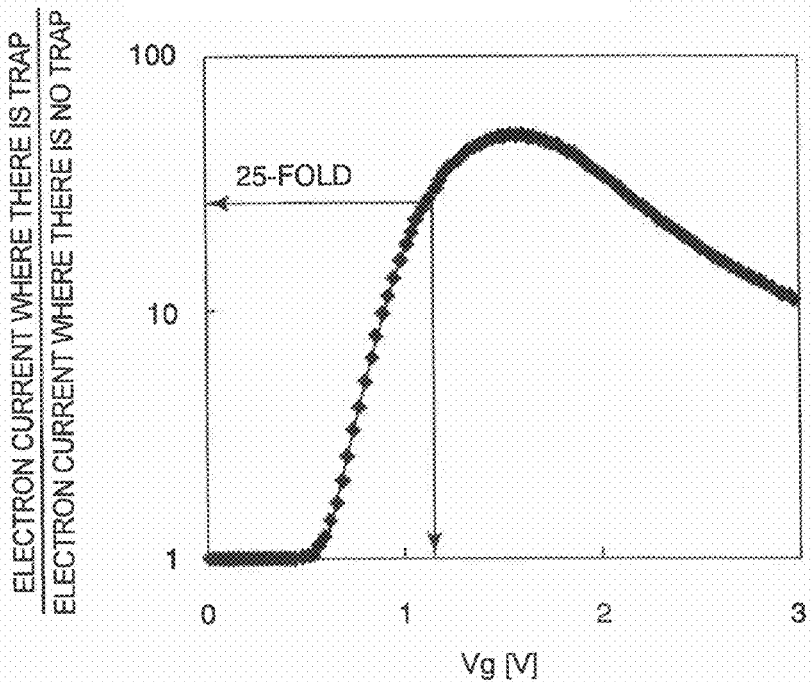
FIG. 21 is a graph showing the dependence of applied voltage on the ratio of the electron current observed where there is an electron trap to the electron current observed where there is not a trap.

As an example, the trap level and the electron injection level observed when Ru is added to a 1.5-nm thick nitrided hafnium silicate film (a HfSiON film) as the high-dielectric layer are now described, with reference to a band diagram. The electron barrier height of nitrided hafnium silicate is 1.6 eV, and the trap level in the nitrided hafnium silicate film formed by the addition of Ru is in the neighborhood of 1.1 eV. After application of a power supply voltage (=−1.1 V), a current flows via this trap. FIG. 21 shows the dependence of the applied voltage on the ratio of the electron current observed where there is a trap (where Ru is added) to the electron current observed where there is not a trap. As can be seen from FIG. 21, the electron current increases almost 25-fold by virtue of the existence of the trap when the power supply voltage (−1.1 V) is applied.

A preferred position of a trap in the film thickness direction is determined from the point where Ex_trap at which the current becomes largest when the power supply voltage is applied intersects with the trap level ($\phi_{trap}$=1.1 eV) in the gate insulating film, as described in the first embodiment.

Figure 22:
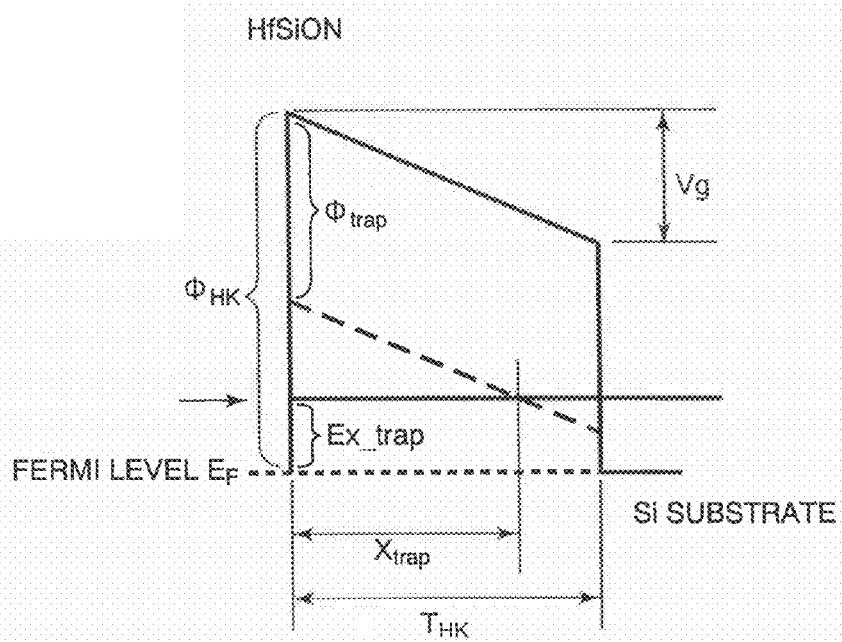
FIG. 22 is a schematic view showing the relationship between the trap level and the electron injection level with a power supply voltage.

Referring now to FIG. 22, the calculation of the trap position $X_{trap}$ from the gate electrode in the film thickness direction is described. The voltage $V_{HK}$ applied to the high-dielectric layer is expressed as:

$$V_{HK} = E_{HK} \times T_{HK} \quad (f)$$

and the power supply voltage Vg is expressed as:

$$Vg = V_{HK} \quad (g)$$

As can be seen from FIG. 22, the electric field $E_{HK}$ in the high-dielectric layer is expressed as:

$$E_{HK} = (\phi_{HK} - \phi_{trap} - Ex\_trap)/X_{trap} \quad (h)$$

According to the equations (f) through (h), the trap position $X_{trap}$ is expressed as:

$$X_{trap} = (\Phi_{HK} - \Phi_{trap} - Ex\_trap) \times T_{HK}/Vg \quad (i)$$

As a result of the calculation of the trap position $X_{trap}$ described above, assuming that a film thickness of the gate insulating film in the nitrided hafium silicate film is 1.5 nm, it becomes apparent that the trap position $X_{trap}$ is 0.8 nm when Ru is added to the nitrided hafnium silicate film. In such a case, a trap should preferably exist closer to the Si substrate than to the center of the gate insulating film of nitrided hafnium silicate.

Figure 23:
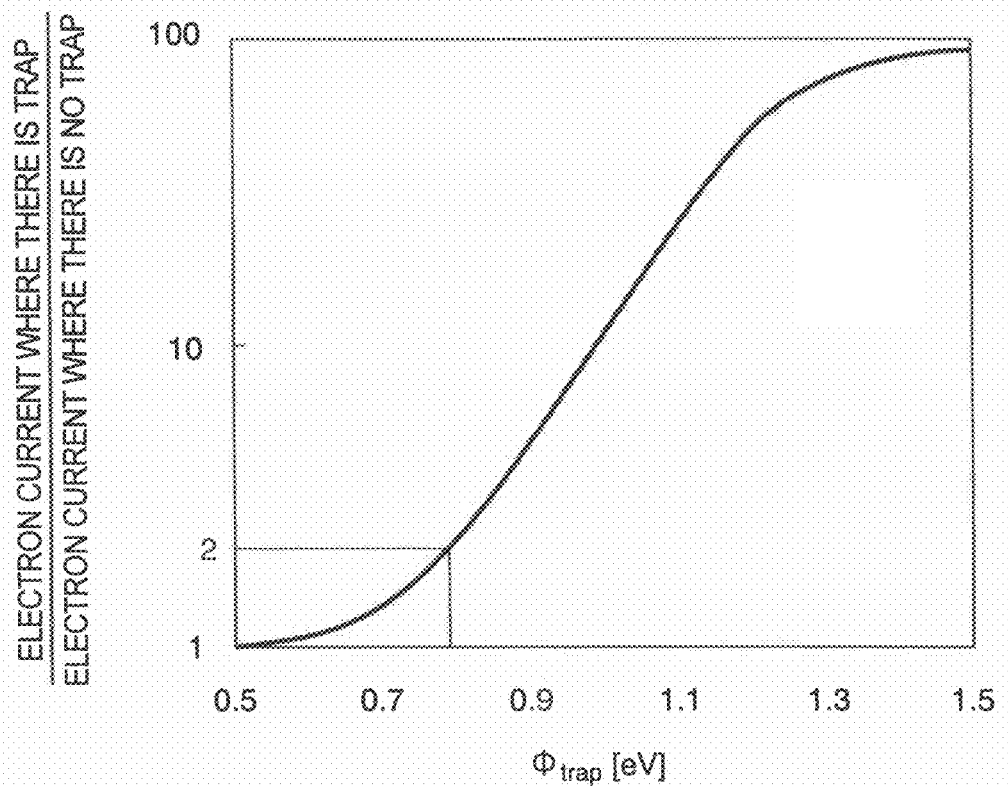
FIG. 23 is a graph showing the dependence of the trap level on the ratio of the electron current observed where there is an electron trap to the electron current observed where there is not a trap.

FIG. 23 shows the dependence of the trap level on the ratio of the electron current flowing where there is a trap to the electron current flowing where there is not a trap in a 1.5-nm thick gate insulating film of nitrided hafnium silicate. As can be seen from FIG. 23, the current increases, as the trap level becomes deeper. However, a large increase in leakage current is not preferable in view of power consumption. Therefore, it is necessary to limit such a trap level region as to be sufficient to modulate the shape parameter β of the Weibull distribution and not to increase the leakage current by too large an amount, as mentioned in the first embodiment. Also, as in the first embodiment, it is preferable to form such a trap level as to increase the electron current twofold to hundredfold in a p-MISFET, and form such a trap level as to increase the hole current twofold to thousandfold in an n-MISFET.

Figure 24:
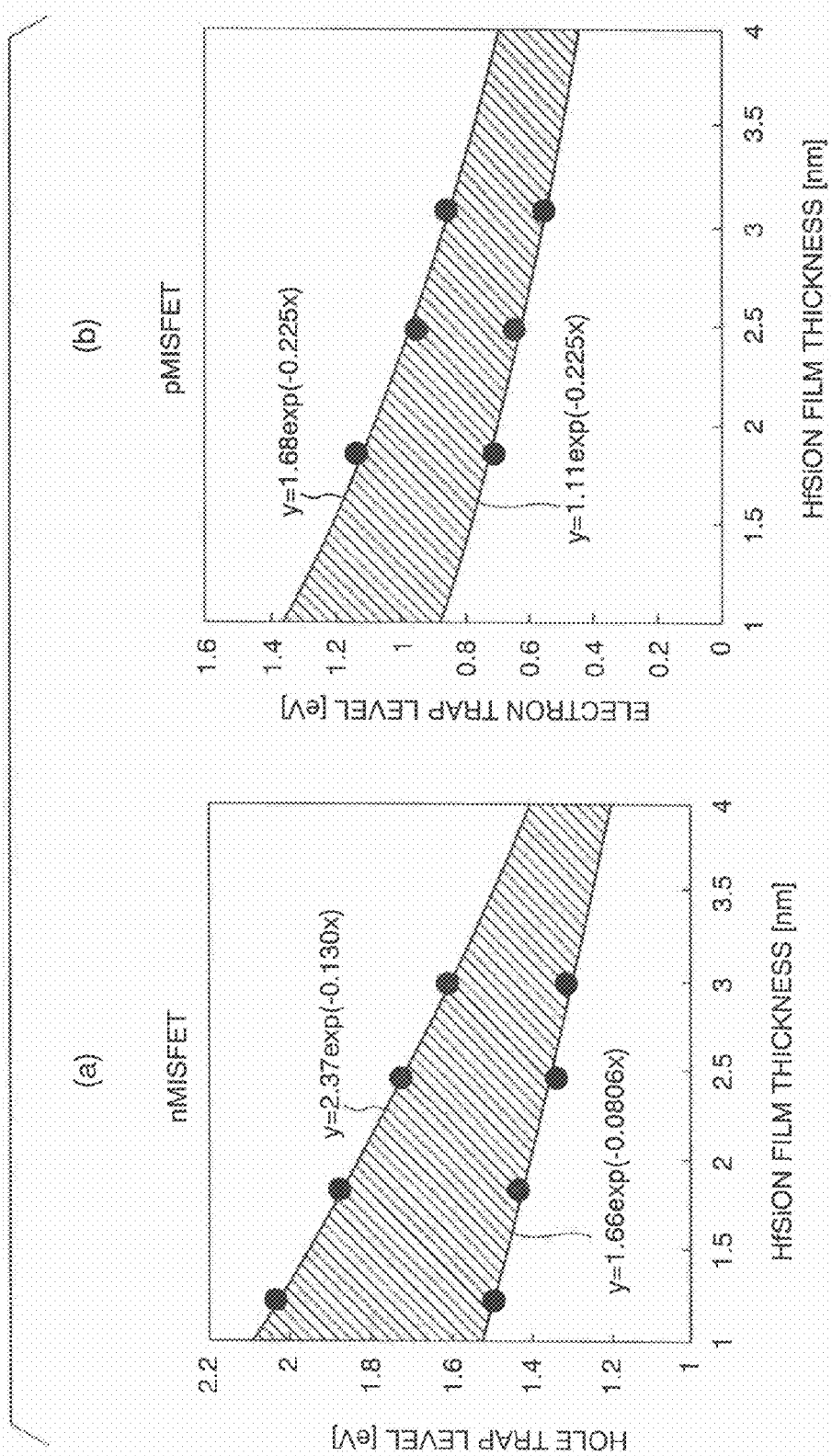
FIGS. 24(a) and 24(b) are graphs showing the preferred ranges of trap levels in a MISFET of the second embodiment.

FIGS. 24(a) and 24(b) show the results of calculations of desired trap level regions in cases where the film thickness of the HfSiON film 12 is varied in an n-MISFET and a p-MISFET. In the n-MISFET, the region interposed between the two functions, y=1.66 exp (−0.0806x) and y=2.37 exp (−0.130x), is the desired trap level region, where x represents the film thickness of the HfSiON film, and y represents the hole trap level (FIG. 24(a)). In the p-MISFET, the region interposed between the two functions, y=1.11 exp (−0.225x) and y=1.68 exp (−0.225x), is the desired trap level region, where x represents the film thickness of the HfSiON film 12, and y represents the electron trap level (FIG. 24(b)). Those regions with the respective film thicknesses are calculated by measuring the trap level dependence of the increases in current caused by the traps shown in FIG. 23 in the n-MISFET and p-MISFET.

Figure 25:
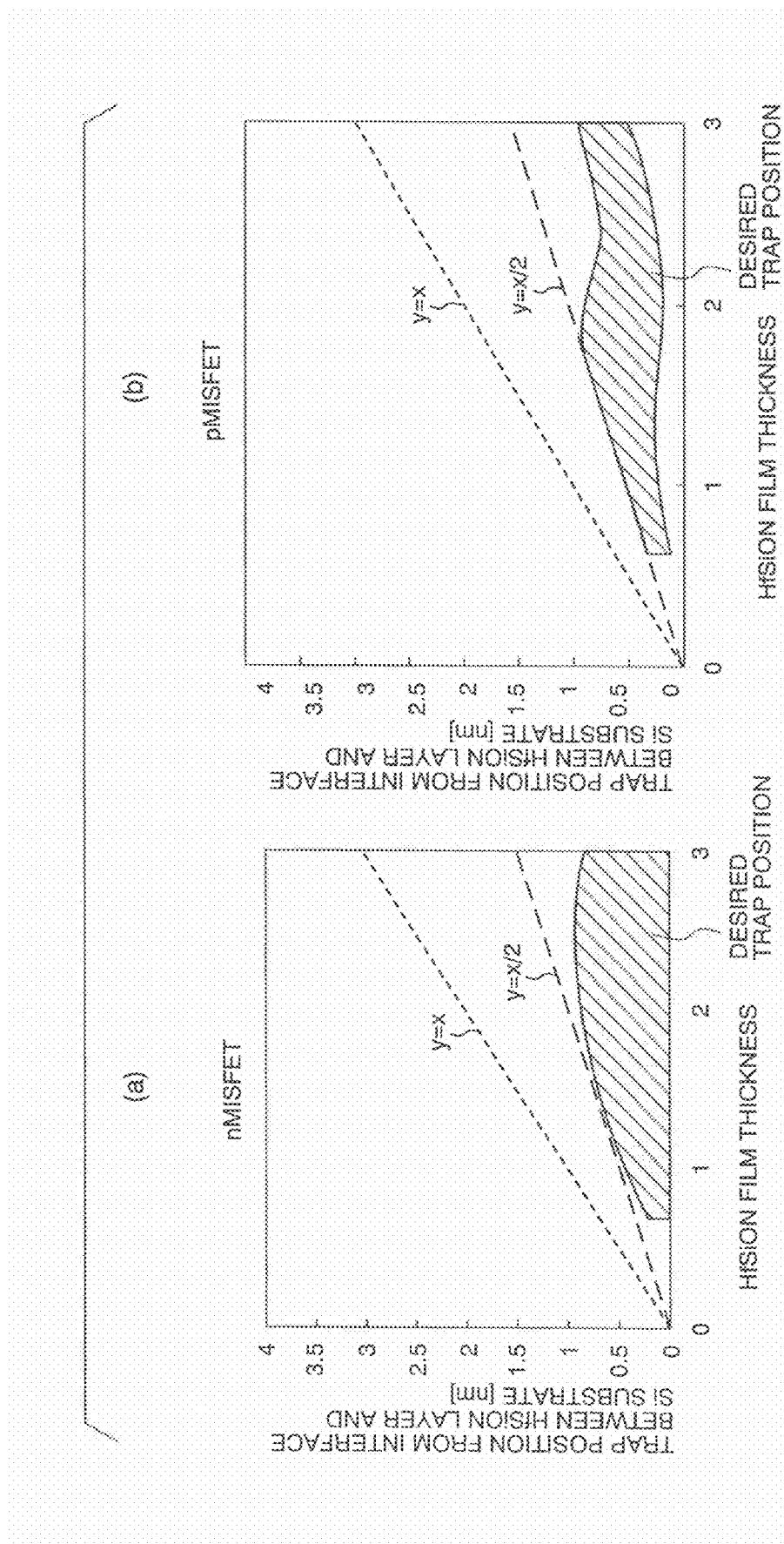
FIGS. 25(a) and 25(b) are graphs showing the preferred ranges of trap positions in a MISFET of the second embodiment.

FIGS. 25(a) and 25(b) show the results of calculations of dependence of the trap position from the interface with the interface with the semiconductor region 2 on the film thickness of the HfSiON film 12 in a case where the film thickness of the HfSiON film 12 is varied in each of the n-MISFET and p-MISFET. As can be seen from these results, the trap positions should preferably be located closer to the semiconductor region side than to the center of the nitrided hafnium silicate film.

The method for manufacturing the semiconductor device of this embodiment is the same as the method for manufacturing the semiconductor device of the first embodiment, except that the procedure for forming the interfacial oxide layer is not carried out, and the high-dielectric layer 12 is formed directly on the semiconductor region 2.

As described above, in accordance with this embodiment, an additional element is added to the high-dielectric layer, so that excellent insulating properties can be maintained in the high-dielectric layer, and a trap can be formed in the high-dielectric layer. Accordingly, the ratio of the minority carriers to the majority carriers can be made higher. With this arrangement, the shape parameter β of the Weibull distribution can be made greater without an increase in leakage current, and the TDDB lifetime can be greatly improved.

In this embodiment, hafnium silicate is used as the high-dielectric layer, and Ru is used as the additional material. However, it is also possible to use a high-dielectric layer made of an oxide containing Zr, Ti, Al, Y, La, Ce or some other rare-earth metal element, instead of Hf. As for the additional element, it is possible to use Nb, Cr, Os, V, or Tc, instead of Ru. Although this embodiment is applied to a p-MISFET, it is also possible to apply this embodiment to an n-MISFET.

(Third Embodiment)

A semiconductor device according to a third embodiment is now described.

In the semiconductor device of the first embodiment illustrated in FIG. 7, the high-dielectric layer 12 of the gate insulating film 10 is made of an oxide containing hafnium. In the third embodiment, an oxide containing lanthanum, such as lanthanum silicate, is used as the high-dielectric layer 12 of the gate insulating film 10. The semiconductor device of this embodiment has the same structure as the semiconductor device of the first embodiment, except for the material of the high-dielectric layer 12 of the gate insulating film 10. The semiconductor device of this embodiment can be used in a logic circuit.

Lanthanum oxide, lanthanum silicate, lanthanum aluminate, or lanthanum alumisilicate can be used as the high-dielectric layer 12 in this embodiment. At least one element selected from the group consisting of V, Cr, Mn, Fe, Zr, Nb, Mo, Tc, Rh, Hf, Ta, Re, Os, and Ir is added to the high-dielectric layer 12. As described in the first embodiment, the preferred density of the additional element ranges from $1\times10^{15}$ cm$^{-3}$ to $2.96\times10^{20}$ cm$^{-3}$.

Figure 26:
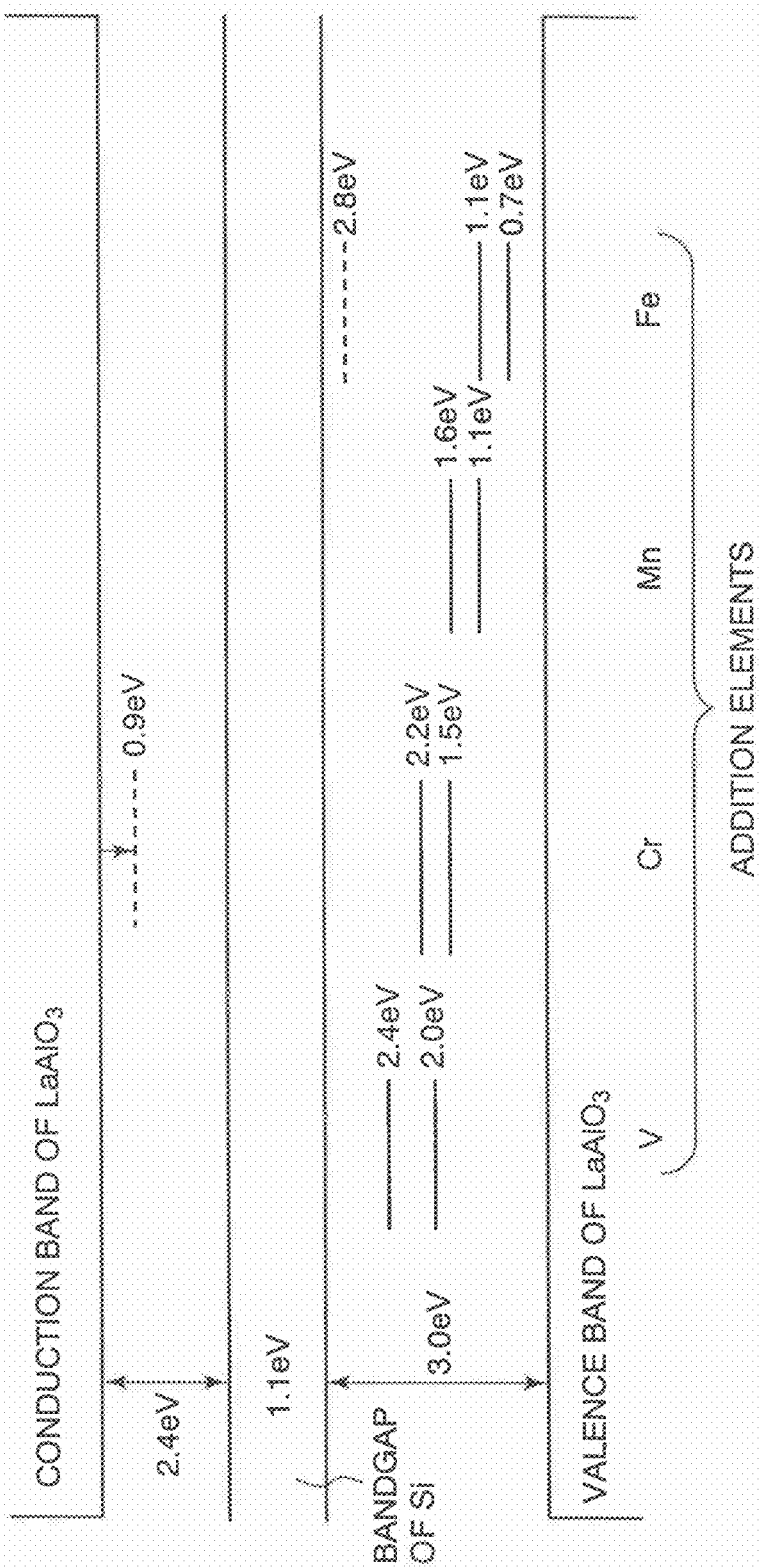
FIG. 26 is a diagram showing the assist levels of electrons and holes that are formed when V, Cr, Mn, or Fe is added to lanthanum aluminate.
Figure 27:
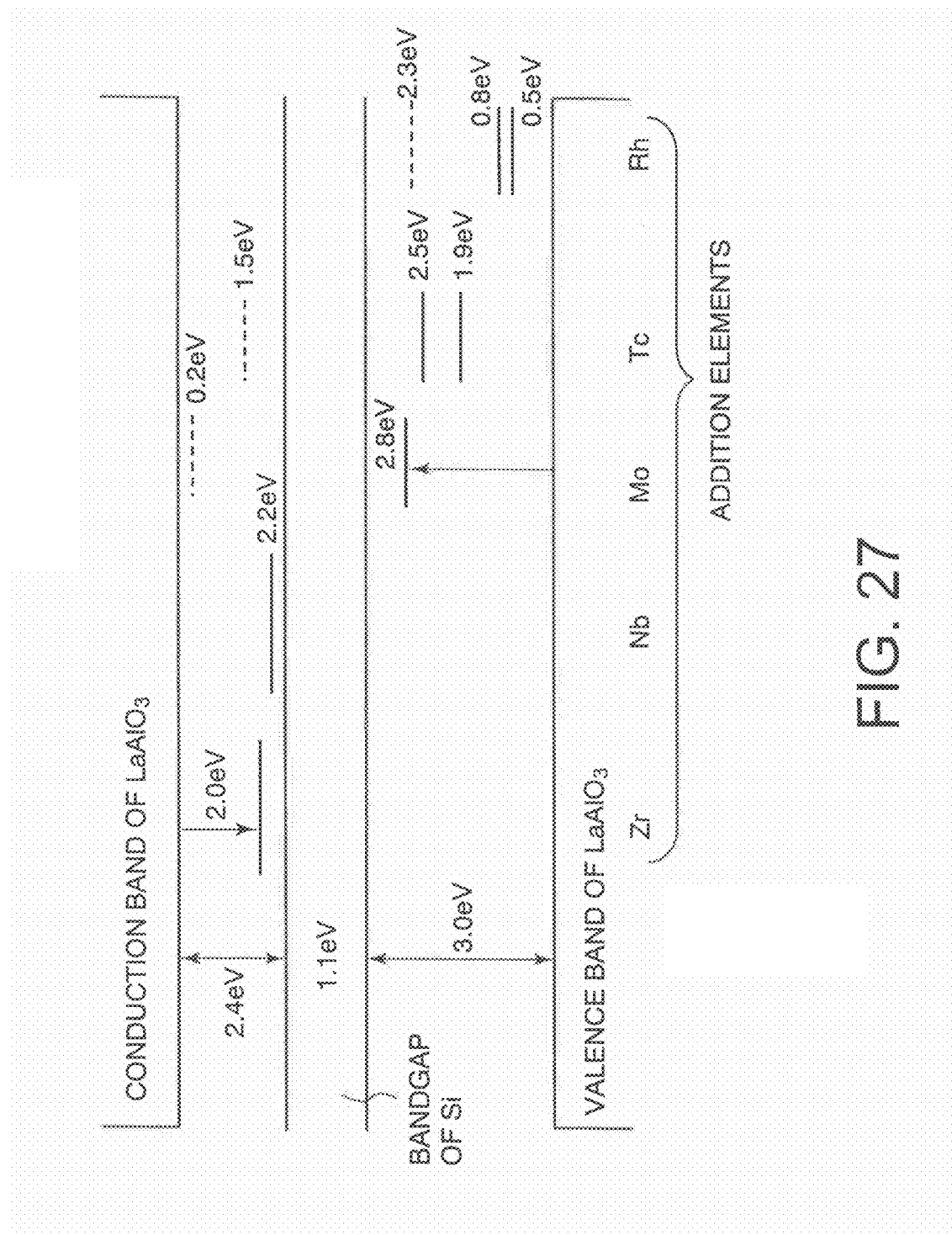
FIG. 27 is a diagram showing the assist levels of electrons and holes that are formed when Zr, Nb, Mo, Tc, or Rh is added to lanthanum aluminate.
Figure 28:
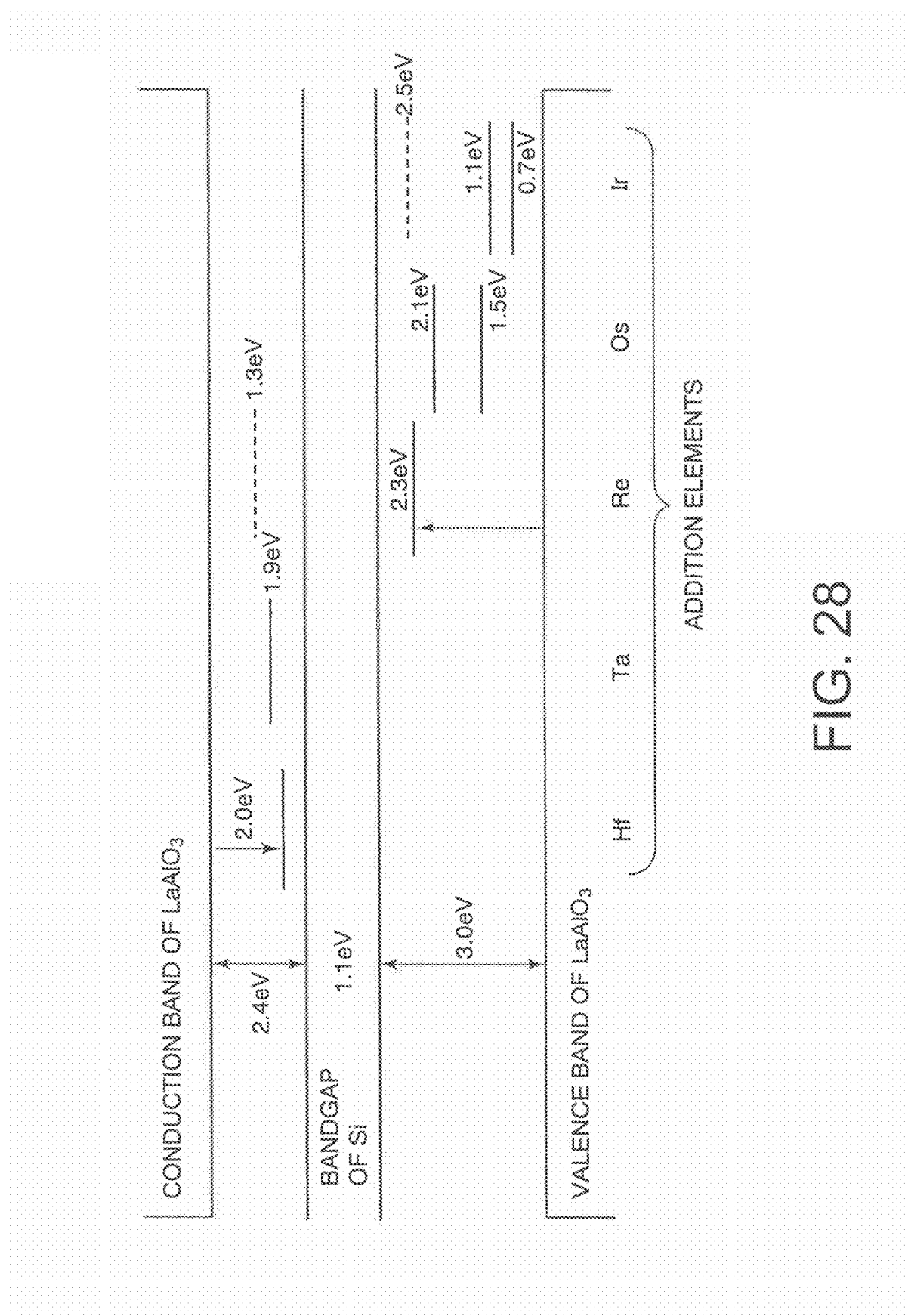
FIG. 28 is a diagram showing the assist levels of electrons and holes that are formed when Hf, Ta, Re, Os, Ir, or Pt is added to lanthanum aluminate.
Figure 29:
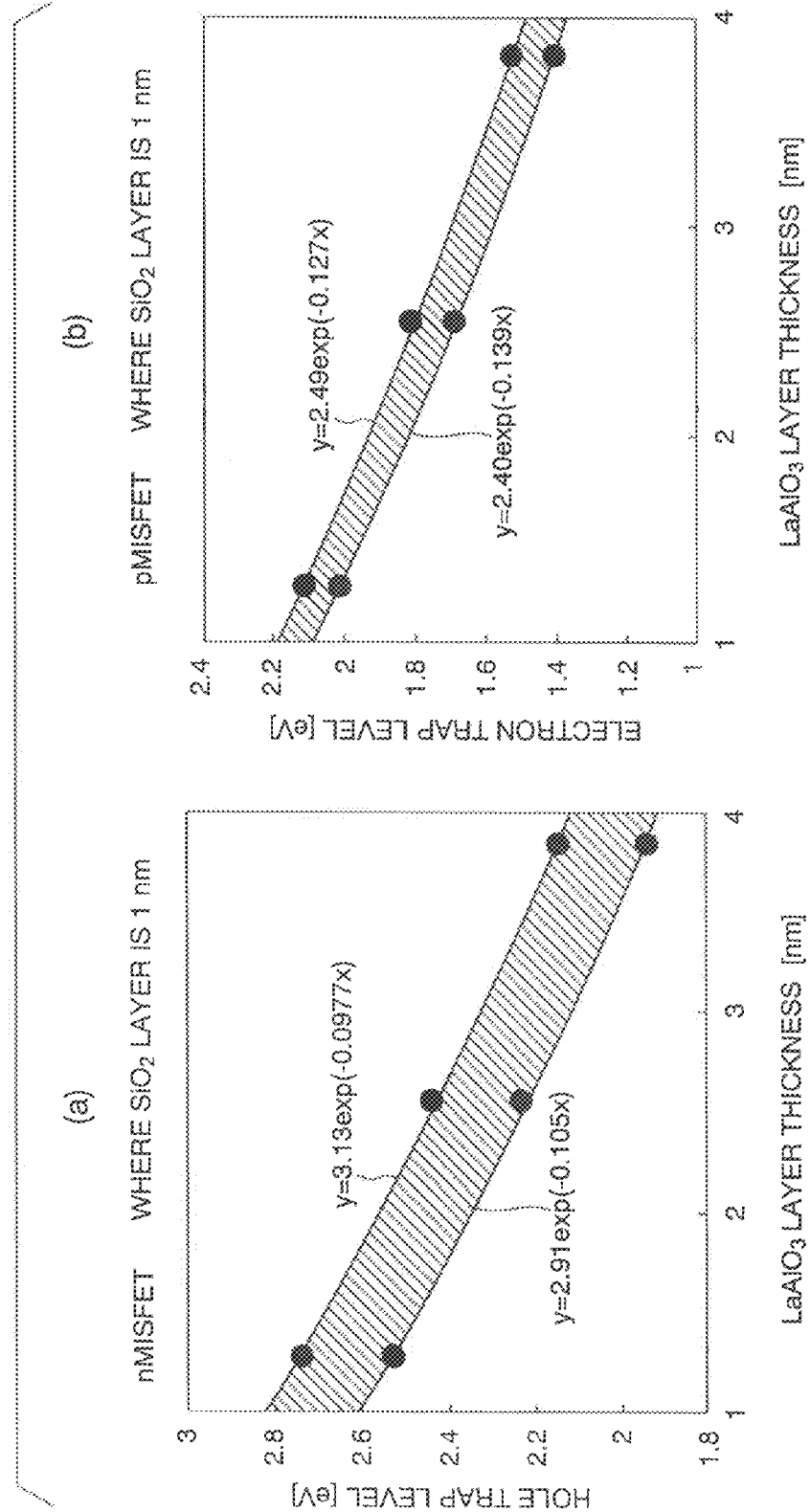
FIGS. 29(a) and 29(b) are graphs showing the preferred ranges of trap levels in a MISFET of a third embodiment.
Figure 30:
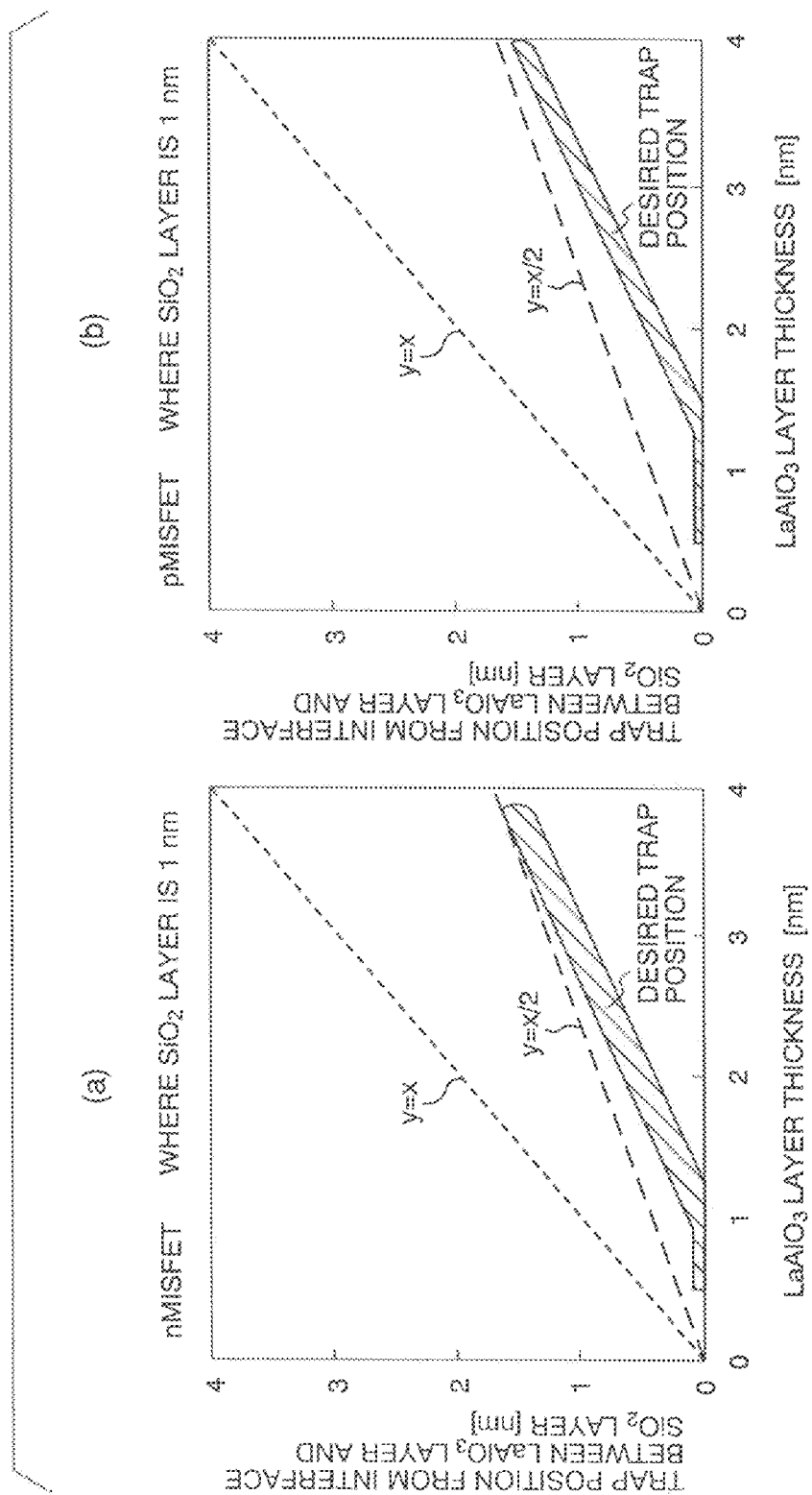
FIGS. 30(a) and 30(b) are graphs showing the preferred ranges of trap positions in a MISFET of the third embodiment.

Those additional elements form trap levels in an insulating film containing a lanthanoid element, according to the first principle calculation. FIGS. 26, 27, and 28 show trap levels that are formed in LaAlO$_3$ by the above additional elements. The trap levels indicated by the solid lines in the drawings are levels that are formed where La is substituted by an additional element, and the trap levels indicated by the broken lines are levels that are formed where Al is substituted by an additional element. Therefore, where the insulating film is made of lanthanum aluminate or lanthanum alumisilicate, an additional element may substitute La or Al, and both trap levels indicated by the solid line and dotted line in each of the FIGS. 26 through 28 can be formed. Also, in a case where the insulating film is made of lanthanum oxide or lanthanum silicate, trap levels are formed where an additional element substitutes La (as indicated by the solid lines in FIGS. 26 through 28).

In the case of lanthanum aluminate or lanthanum alumisilicate, the elements that from traps at levels near the conduction band are Zr, Nb, Tc, Hf, Ta, and Re, which are preferred as elements to be added to a p-MISFET. The elements that form traps at levels near the valence band are V, Cr, Mn, Fe, Mo, Tc, Rh, Re, Os, and Ir, which are preferred as elements to be added to an n-MISFET. In the case of lanthanum oxide or lanthanum silicate, the elements that from traps at levels near the conduction band are Zr, Nb, Hf, and Ta, which are preferred as elements to be added to a p-MISFET. The elements that form traps at levels near the valence band are V, Cr, Mn, Fe, Mo, Tc, Rh, Re, Os, and Ir, which are preferred as elements to be added to an n-MISFET.

FIGS. 29(a) through 30(b) show the results of calculations performed to determine trap levels and trap positions in the film thickness direction as required to increase the shape parameter β of the Weibull distribution according to the procedures described in the first embodiment. Here, the dielectric constant of lanthanum aluminate is 25, the barrier height against electrons is 2.4 eV, and the barrier height against holes is 3.0 eV. In the n-MISFET, the region interposed between the two functions, y=2.91 exp (−0.105x) and y=3.13 exp (−0.0977x), is the desired trap level region, where x represents the layer thickness of the LaAlO$_3$ layer, and y represents the hole trap level (FIG. 29(a)). In the p-MISFET, the region interposed between the two functions, y=2.40 exp (−0.139x) and y=2.49 exp (−0.127x), is the desired trap level region, where x represents the layer thickness of the LaAlO$_3$ layer, and y represents the electron trap level (FIG. 29(b)).

Based on the results shown in FIGS. 29(a) and 29(b), an appropriate element can be selected from those shown in FIGS. 26 through 28 for the layer thickness of the high-dielectric layer 12 and each of the n-MISFET and p-MISFET. FIGS. 30(a) and 30(b) show the dependence of the trap position from the interface with the semiconductor region 2 on the layer thickness of the LaAlO$_3$ layer 12 in a case where the film thickness of the LaAlO$_3$ layer 12 is varied in each of the n-MISFET and p-MISFET. It is preferable to form such an additional element distribution as to have peaks at the positions shown in FIGS. 30(a) and 30(b). Where the lanthanum aluminate layer to be the high-dielectric layer 12 is thicker than 2 nm, the additional element distribution should preferably concentrate on the center of the lanthanum aluminate layer, as can be seen from FIGS. 30(a) and 30(b). Where the lanthanum aluminate layer is thinner than 2 nm, the additional element distribution should preferably be located in a region near the interface between the lanthanum aluminate layer and the SiO$_2$ layer to be the interfacial oxide layer.

The above introduction of an element is performed by depositing a layer of the additional element by CVD, ALD, or sputtering after an insulating layer such as a lanthanum aluminate layer is deposited by CVD, ALD, or sputtering. The additional element can be then diffused into the insulating film by performing a heating process in a later stage.

Alternatively, during the deposition of an insulating layer such as a lanthanum aluminate layer by ALD or sputtering, a layer of an additional element may be deposited by ALD or sputtering, and an insulating layer such as a lanthanum aluminate layer is again deposited by ALD or sputtering, thereby introducing the additional element into the insulating layer. Alternatively, after a SiO$_2$ layer to be the interfacial oxide layer is deposited or formed through thermal oxidation on a silicon substrate, a layer of an additional element may be deposited on the SiO$_2$ layer by ALD, CVD, or sputtering, and an insulating layer such as a lanthanum aluminate layer may be deposited on the additional element layer by ALD, CVD, or sputtering. The additional element can be diffused into the insulating layer by performing a heating process in a later stage. Alternatively, after the deposition of an insulating layer, an additional element can be introduced into the insulating layer through ion implantation.

In this embodiment, the interfacial oxide layer is a silicon oxide layer, but it may be a silicon oxynitride layer.

Although the high-dielectric layer contains La in this embodiment, it may contain at least one element selected from the group consisting of lanthanoids (Ce, Pr, Nd, Pm, Sm, Eu, Gd, Tb, Dy, Ho, Er, Tm, Yb, and Lu), instead of La.

As described above, in accordance with this embodiment, an additional element is added to the high-dielectric layer, so that excellent insulating properties can be maintained in the high-dielectric layer, and a trap can be formed in the high-dielectric layer. Accordingly, the ratio of the minority carriers to the majority carriers can be made higher. With this arrangement, the shape parameter β of the Weibull distribution can be made greater without an increase in leakage current, and the TDDB lifetime can be greatly improved.

(Fourth Embodiment)

A semiconductor device according to a fourth embodiment is now described.

The semiconductor device of this embodiment is the same as the semiconductor device of the third embodiment, except that the interfacial oxide layer 11 is removed from the gate insulating film 10. In short, the gate insulating film 10 is formed only with the high-dielectric layer 12 such as a lanthanum aluminate layer in this embodiment. The semiconductor device of this embodiment can be used in a logic circuit.

In the fourth embodiment, the additional elements that can be added to the high-dielectric layer 12 are the same as the additional elements mentioned in the third embodiment, and the density of any one of the additional elements preferably ranges from $1\times10^{15}$ cm$^{-3}$ to $2.96\times10^{20}$ cm$^{-3}$, as described in the first embodiment.

Figure 31:
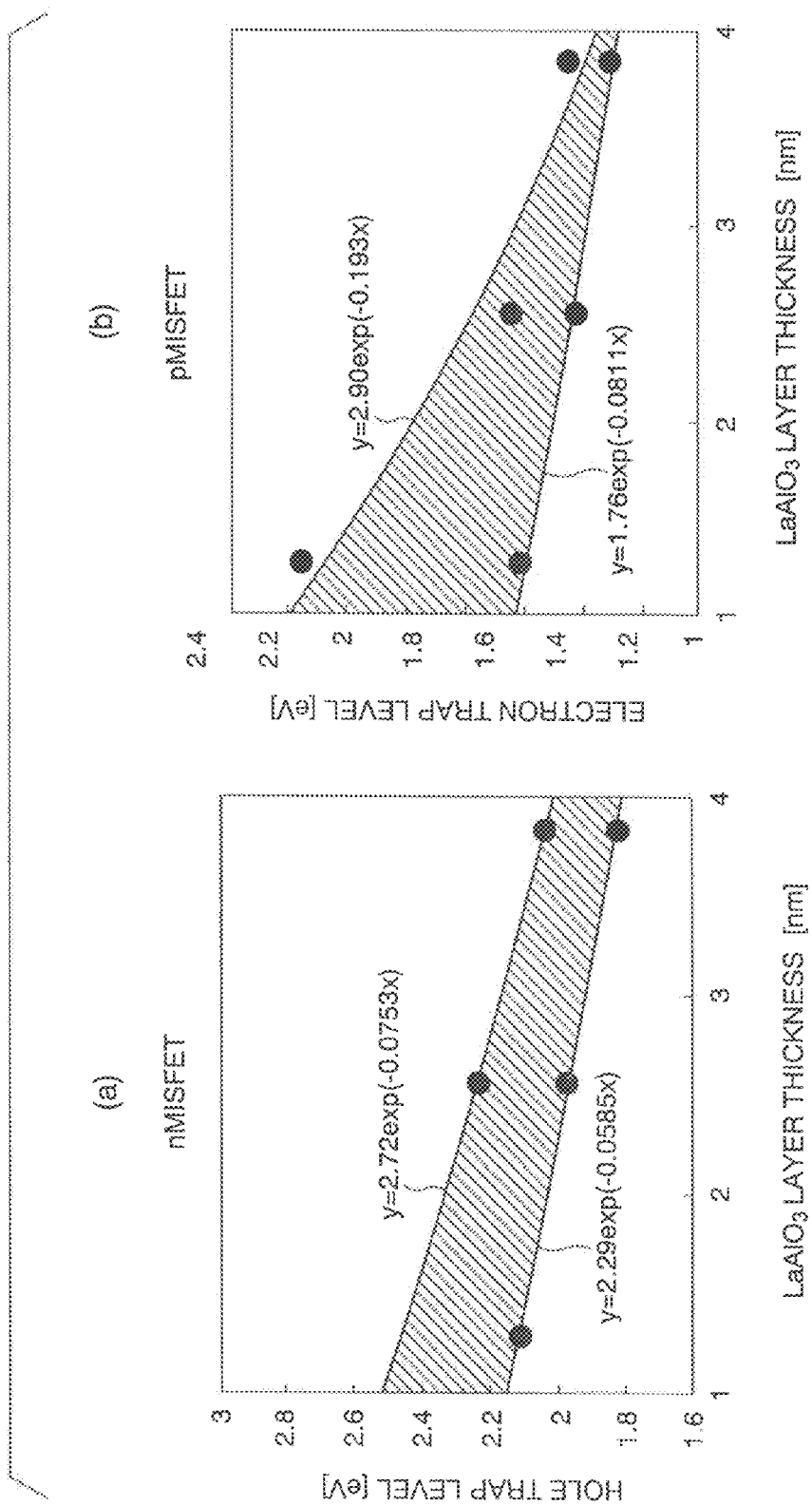
FIGS. 31(a) and 31(b) are graphs showing the preferred ranges of trap levels in a MISFET of a fourth embodiment.

FIGS. 31(a) and 31(b) show the results of calculations performed to determine trap levels and trap positions in the film thickness direction as required to increase the shape parameter β of Weibull distribution according to the procedures described in the first embodiment. Here, the gate insulating film 10 is formed with a lanthanum aluminate film (LaAlO$_3$ film) as the high-dielectric layer 12. The dielectric constant of lanthanum aluminate is 25, the barrier height against electrons is 2.4 eV, and the barrier height against holes is 3.0 eV. In the n-MISFET, the region interposed between the two functions, y=2.29 exp (−0.0585x) and y=2.72 exp (−0.0753x), is the desired trap level region, where x represents the film thickness of the LaAlO$_3$ film, and y represents the hole trap level (FIG. 31($a$)). In the p-MISFET, the region interposed between the two functions, y=1.76 exp (−0.0811x) and y=2.90 exp (−0.193x), is the desired trap level region, where x represents the film thickness of the LaAlO$_3$ film, and y represents the electron trap level (FIG. 31($b$)).

Figure 32:
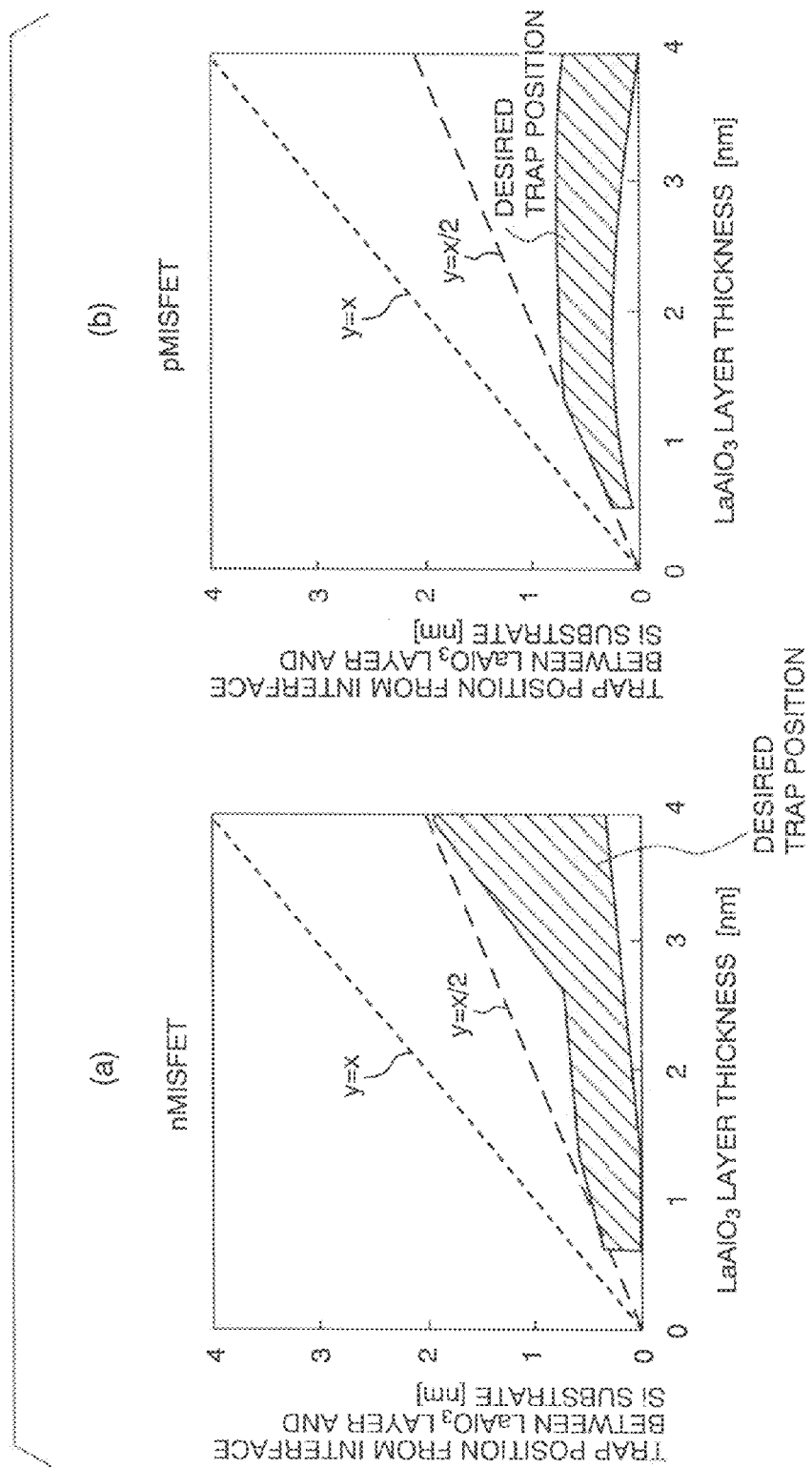
FIGS. 32(a) and 32(b) are graphs showing the preferred ranges of trap positions in a MISFET of the fourth embodiment.

Based on the results shown in FIGS. 31($a$) and 31($b$), an appropriate element can be selected from those shown in FIGS. 26 through 28 for the film thickness of each aluminate film (LaAlO$_3$ film) as the high-dielectric layer 12, and each of the n-MISFET and p-MISFET. FIGS. 32($a$) and 32($b$) show the dependence of the trap position from the interface with the semiconductor region 2 on the film thickness of the LaAlO$_3$ film 12 in a case where the film thickness of the LaAlO$_3$ film 12 is varied in each of the n-MISFET and p-MISFET. It is preferable to form such an additional element distribution as to have peaks at the positions shown in FIGS. 32($a$) and 32($b$). The additional element should preferably be distributed on the side of the semiconductor region 2 from the center of the LaAlO$_3$ film 12.

The introduction of an additional element into the high-dielectric layer 12 is performed in the same manner as in the third embodiment.

As described above, in accordance with this embodiment, an additional element is added to the high-dielectric layer, so that excellent insulating properties can be maintained in the high-dielectric layer, and a trap can be formed in the high-dielectric layer, as in the third embodiment. Accordingly, the ratio of the minority carriers to the majority carriers can be made higher. With this arrangement, the shape parameter β of the Weibull distribution can be made greater without an increase in leakage current, and the TDDB lifetime can be greatly improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device, comprising
a MISFET comprising:
a semiconductor layer including a semiconductor region formed therein;
a gate insulating film formed above the semiconductor region, and including a metal oxide layer containing a metal and oxygen, the metal contained in the metal oxide layer being at least one selected from Hf and Zr, the metal oxide layer further including at least one element selected from the group consisting of Ru, Cr, Os, V, Tc, and Nb, the metal oxide layer having trap levels so that a ratio of minority carriers to majority carries in a current flowing via the trap levels can be made higher, the trap levels capturing or releasing charges formed by inclusion of the at least one element, density of the at least one element in the metal oxide layer being in the range of 1 ×10$^{15}$ cm$^{-3}$ to 2.96 ×10$^{20}$ cm$^{-3}$, the trap levels being distributed to have a peak closer to the semiconductor region than to a center of the metal oxide layer; and
a gate electrode formed on the gate insulating film,
wherein when the MISFET is an n-MISFET, the majority carriers are electrons and the minority carriers are holes, and
when the MISFET is a p-MISFET, the majority carriers are holes and the minority carriers are electrons.

2. The device according to claim 1, wherein
when the MISFET is an n-MISFET, the element being included is at least one element selected from the group consisting of Ru, Os, V, Cr, and Tc; and
when the MISFET is a p-MISFET, the element being included is at least one element selected from the group consisting of Ru, Os, V, and Nb.

3. The semiconductor device according to claim 1, wherein a silicon oxide layer or a silicon oxynitride layer is formed between the metal oxide layer and the semiconductor region.

4. A semiconductor device, comprising
a MISFET comprising:
a semiconductor layer including a semiconductor region formed therein;
a gate insulating film formed above the semiconductor region, and including a metal oxide layer containing a metal and oxygen, the metal contained in the metal oxide layer being at least one selected from the group consisting of La, Ce, Pr, Nd, Pm, Sm, Eu, Gd, Tb, Dy, Ho, Er, Tm, Yb, and Lu, the metal oxide layer further including at least one element selected from the group consisting of V, Cr, Mn, Fe, Zr, Nb, Mo, Tc, Rh, Hf, Ta, Re, Os, and Ir, the metal oxide layer having trap levels so that a ratio of minority carriers to majority carries in a current flowing via the trap levels can be made higher, the trap levels capturing or releasing charges formed by addition of the element, density of the at least one element in the metal oxide layer being in the range of 1×10$^{15}$ cm$^{-3}$ to 2.96× 10$^{20}$ cm$^{-3}$, the trap levels being distributed to have a peak closer to the semiconductor region than to a center of the metal oxide layer; and
a gate electrode formed on the gate insulating film,
wherein when the MISFET is an n-MISFET, the majority carriers are electrons and the minority carriers are holes, and
when the MISFET is a p-MISFET, the majority carriers are holes and the minority carriers are electrons.

5. The device according to claim 4, wherein
when the MISFET is an n-MISFET, the element being included is at least one element selected from the group consisting of V, Cr, Mn, Fe, Mo, Tc, Rh, Re, Os, and Ir; and
when the MISFET is a p-MISFET, the element being added is at least one element selected from the group consisting of Zr, Nb, Hf, and Ta.

6. The device according to claim 4, wherein
the metal contained in the metal oxide layer further includes Al,
when the MISFET is an n-MISFET, the element being included is at least one element selected from the group consisting of V, Cr, Mn, Fe, Mo, Tc, Rh, Re, Os, and Ir; and
when the MISFET is a p-MISFET, the element being included is at least one element selected from the group consisting of Zr, Nb, Tc, Hf, Ta, and Re.

7. The semiconductor device according to claim 4, wherein a silicon oxide layer or a silicon oxynitride layer is formed between the metal oxide layer and the semiconductor region.

8. A semiconductor device, comprising
a MISFET comprising:
a semiconductor layer including a semiconductor region formed therein;

a gate insulating film formed above the semiconductor region, and including a metal oxide layer containing a metal and oxygen, the metal contained in the metal oxide layer being at least one selected from Hf and Zr, the metal oxide layer further including at least one element selected from the group consisting of Ru, Os, and Tc, the metal oxide layer having trap levels so that a ratio of minority carriers to majority carries in a current flowing via the trap levels can be made higher, the trap levels capturing or releasing charges formed by inclusion of the at least one element, density of the at least one element in the metal oxide layer being in the range of $1 \times 10^{15}$ cm$^{-3}$ to $2.96 \times 10^{20}$ cm$^{-3}$, the trap levels being distributed to have a peak closer to the semiconductor region than to a center of the metal oxide layer; and a gate electrode formed on the gate insulating film, wherein when the MISFET is an n-MISFET, the majority carriers are electrons and the minority carriers are holes, and when the MISFET is a p-MISFET, the majority carriers are holes and the minority carriers are electrons.

* * * * *